(12) United States Patent
Atsumi et al.

(10) Patent No.: US 9,443,563 B2
(45) Date of Patent: *Sep. 13, 2016

(54) SEMICONDUCTOR DEVICE AND DRIVING METHOD THEREOF

(71) Applicant: SEMICONDUCTOR ENERGY LABORATORY CO., LTD., Atsugi-shi, Kanagawa-ken (JP)

(72) Inventors: Tomoaki Atsumi, Kanagawa (JP); Yoshiya Takewaki, Urasoe (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/678,098

(22) Filed: Apr. 3, 2015

(65) Prior Publication Data

US 2015/0213842 A1    Jul. 30, 2015

Related U.S. Application Data

(63) Continuation of application No. 13/455,188, filed on Apr. 25, 2012, now Pat. No. 9,001,563.

(30) Foreign Application Priority Data

Apr. 29, 2011  (JP) ................................ 2011-102567
May 19, 2011  (JP) ................................ 2011-112818

(51) Int. Cl.
*G11C 5/10* (2006.01)
*G11C 11/4091* (2006.01)
(Continued)

(52) U.S. Cl.
CPC ............. *G11C 5/10* (2013.01); *G11C 11/401* (2013.01); *G11C 11/404* (2013.01);
(Continued)

(58) Field of Classification Search
None
See application file for complete search history.

(56) References Cited

U.S. PATENT DOCUMENTS

| | | | |
|---|---|---|---|
| 4,777,625 A | 10/1988 | Sakui et al. | |
| 5,278,797 A * | 1/1994 | Jeon ....................... | G11C 11/406 365/189.07 |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fan.Y et al., "Indium—Gallium—Zinc—Oxide Based Resistive Switching Memory for System-on-Glass Application", IDW '11: Proceedings of the 18th International Display Workshops, Dec. 7, 2011, pp. 575-577.

(Continued)

*Primary Examiner* — James G Norman
(74) *Attorney, Agent, or Firm* — Fish & Richardson P.C.

(57) ABSTRACT

In a memory module including a memory cell array including memory cells arranged in matrix, each including a first transistor using an oxide semiconductor and a first capacitor; a reference cell including a p-channel third transistor, a second capacitor, and a second transistor using an oxide semiconductor; and a refresh timing detection circuit including a resistor and a comparator, wherein when a potential is supplied to the first capacitor through the first transistor, a potential is supplied to the second capacitor through the second transistor, wherein a drain current value of the third transistor is changed in accordance with the potential stored in the second capacitor, and wherein when the drain current value of the third transistor is higher than a given value, a refresh operation of the memory cell array and the reference cell are performed.

16 Claims, 23 Drawing Sheets

(51) Int. Cl.
    *G11C 11/406* (2006.01)
    *G11C 11/401* (2006.01)
    *G11C 11/404* (2006.01)
    *G11C 11/4099* (2006.01)
    *H01L 27/12* (2006.01)
    *H01L 27/108* (2006.01)

(52) U.S. Cl.
    CPC ........ *G11C 11/406* (2013.01); *G11C 11/4091* (2013.01); *G11C 11/4099* (2013.01); *H01L 27/10897* (2013.01); *H01L 27/1218* (2013.01); *H01L 27/1225* (2013.01); *H01L 27/10873* (2013.01)

(56) References Cited

U.S. PATENT DOCUMENTS

| | | |
|---|---|---|
| 5,528,032 A | 6/1996 | Uchiyama |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager, III et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,888,207 B2 | 2/2011 | Wager, III et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1* | 11/2003 | Wager, III ............... H01L 29/02 257/410 |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0001231 A1* | 1/2007 | Currie ............... H01L 21/28202 257/368 |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0158137 A1* | 7/2008 | Yoshida ............... G09G 3/3413 345/102 |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0122673 A1 | 5/2011 | Kamata et al. |
| 2011/0156117 A1 | 6/2011 | Yamazaki et al. |
| 2011/0205774 A1 | 8/2011 | Takemura |
| 2011/0280061 A1 | 11/2011 | Saito et al. |
| 2012/0033483 A1 | 2/2012 | Koyama |
| 2012/0039126 A1 | 2/2012 | Saito |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-252490 A | 9/1992 |
| JP | 04-344387 A | 11/1992 |
| JP | 05-205465 A | 8/1993 |
| JP | 05-251705 A | 9/1993 |
| JP | 06-275697 A | 9/1994 |
| JP | 07-254272 A | 10/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-269979 A | 9/2002 |
| JP | 2002-289859 A | 10/2002 |
| JP | 2003-086000 A | 3/2003 |
| JP | 2003-086808 A | 3/2003 |

(56) References Cited

FOREIGN PATENT DOCUMENTS

| JP | 2004-103957 A | 4/2004 |
|---|---|---|
| JP | 2004-273614 A | 9/2004 |
| JP | 2004-273732 A | 9/2004 |
| JP | 2006-502597 | 1/2006 |
| JP | 2012-064930 A | 3/2012 |
| WO | WO-2004/038757 | 5/2004 |
| WO | WO-2004/114391 | 12/2004 |

OTHER PUBLICATIONS

Kim.K, "Technology for sub-50nm DRAM and NAND Flash Manufacturing", IEDM 05: Technical Digest of International Electron Devices Meeting, Dec. 5, 2005, pp. 333-336.

Mueller.W et al., "Challenges for the DRAM Cell Scaling to 40nm", IEDM 05: Technical Digest of International Electron Devices Meeting, 2005, pp. 347-350.

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Kim.H et al., "Three-Dimensional Integration Approach to High-Density Memory Devices", IEEE Transactions on Electron Devices, Nov. 1, 2011, vol. 58, No. 11, pp. 3820-3828.

Kim.S et al., "High-Performance oxide thin film transistors passivated by various gas plasmas", 214th ECS Meeting, 2008, No. 2317, ECS.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Park.S et al., "Challenge to Future Displays: Transparent AM-OLED Driven by PEALD Grown ZnO TFT", IMID '07 Digest, 2007, pp. 1249-1252.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Park.J et al., "High performance amorphous oxide thin film transistors with self-aligned top-gate structure", IEDM 09: Technical Digest of International Electron Devices Meeting, Dec. 7, 2009, pp. 191-194.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Fung.T et al., "2-D Numerical Simulation of High Performance Amorphous In—Ga—Zn—O TFTs for Flat Panel Display", AM-FPD '08 Digest of Technical Papers, Jul. 2, 2008, pp. 251-252, The Japan Society of Applied Physics.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Tsuda.K et al., "Ultra Low Power Consumption Technologies for Mobile TFT-LCDs", IDW '02 : Proceedings of the 9th International Display Workshops, Dec. 4, 2002, pp. 295-298.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Mo.Y et al., "Amorphous Oxide TFT Backplanes for Large Size AMOLED Displays", IDW '08 : Proceedings of the 6th International Display Workshops, Dec. 3, 2008, pp. 581-584.

Lee.H et al., "Current Status of, Challenges to, and Perspective View of AM-OLED", IDW '06:Proceedings of the 13th International Display Workshops, Dec. 7, 2006, pp. 663-666.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kikuchi.H et al., "Polymer-Stabilized Liquid Crystal Blue Phases", Nature Materials, Sep. 2, 2002, vol. 1, pp. 64-68.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kitzerow.H et al., "Observation of Blue Phases in Chiral Networks", Liquid Crystals, 1993, vol. 14, No. 3, pp. 911-916.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Nakamura.M, "Synthesis of Homologous Compound with New Long-Period Structure", NIRIM Newsletter, Mar. 1, 1995, vol. 150, pp. 1-4.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Clark.S et al., "First Principles Methods Using CASTEP", Zeitschrift fur Kristallographie, 2005, vol. 220, pp. 567-570.

Asakuma.N et al., "Crystallization and Reduction of Sol-Gel-Derived Zinc Oxide Films by Irradiation With Ultaviolet Lamp", Journal of Sol-Gel Science and Technology, 2003, vol. 26, pp. 181-184.

(56) References Cited

OTHER PUBLICATIONS

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Miyasaka.M, "SUFTLA Flexible Microelectronics on Their Way to Business", SID Digest '07 : SID International Symposium Digest of Technical Papers, 2007, vol. 38, pp. 1673-1676.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Hsieh.H et al., "P-29:Modeling of Amorphous Oxide Semiconductor Thin Film Transistors and Subgap Density of States", SID International Symposium Digest of Technical Papers, May 20, 2008, vol. 39, pp. 1277-1280.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Nowatari.H et al., "60.2: Intermediate Connector With Suppressed Voltage Loss for White TANDEM OLDEDs", SID Digest '09 : SID International Symposium Digest of Technical Papers, May 31, 2009, vol. 40, pp. 899-902.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kurokawa.Y et al., "UHF RFCPUS on Flexible and Glass Substrates for Secure RFID Systems", Journal of Solid-State Circuits , 2008, vol. 43, No. 1, pp. 292-299.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Kimizuka.N et al., "Spinel,$YBFE_2O_4$, and $YB_2FE_3O_7$ Types of Structures for Compounds in the $In_2O_3$ and $Sc_2O_3$—$A_2O_3$—BO Systems [A; Fe, Ga, or Al; B:Mg, Mn, Fe, Ni, Cu,or Zn] at Temperatures Over 1000° C.", Journal of Solid State Chemistry, 1985, vol. 60, pp. 382-384.

Orita.M et al., "Mechanism of Electrical Conductivity of Transparent $InGaZnO4$", Phys. Rev. B (Physical Review. B), Jan. 15, 2000, vol. 61, No. 3, pp. 1811-1816.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Janotti.A et al., "Native Point Defects in ZnO", Phys. Rev. B (Physical Review. B), Oct. 4, 2007, vol. 76, No. 16, pp. 165202-1-165202-22.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide $InGaO_3(ZnO)m$ (m<4):a Zn4s conductor", Philosophical Magazine, 2001, vol. 81, No. 5, pp. 501-515.

Ueno.K et al., "Field-Effect Transistor on $SrTiO3$ With Sputtered $Al2O3$ Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline $InGaO3(ZnO)5$ films", Appl. Phys. Lett. (Applied Physics Letters) , Sep. 13, 2004, vol. 85, No. 11, pp. 1993-1995.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Janotti.A et al., "Oxygen Vacancies in ZnO", Appl. Phys. Lett. (Applied Physics Letters) , 2005, vol. 87, pp. 122102-1-122102-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

* cited by examiner

FIG. 7A
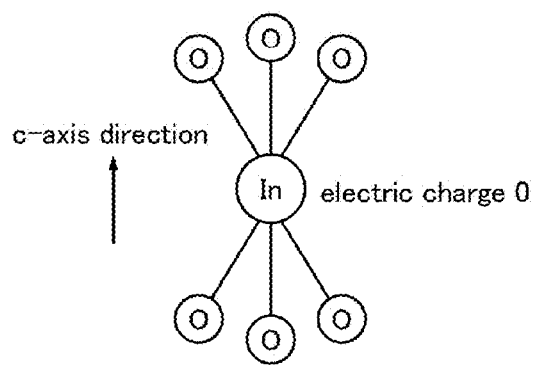
FIG. 7D
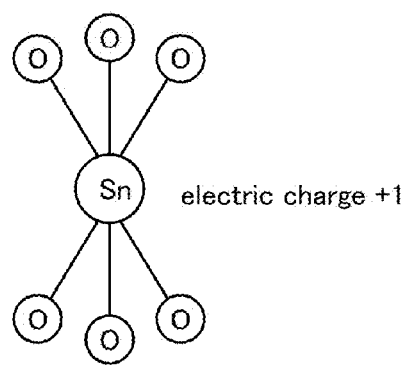
FIG. 7B
FIG. 7E
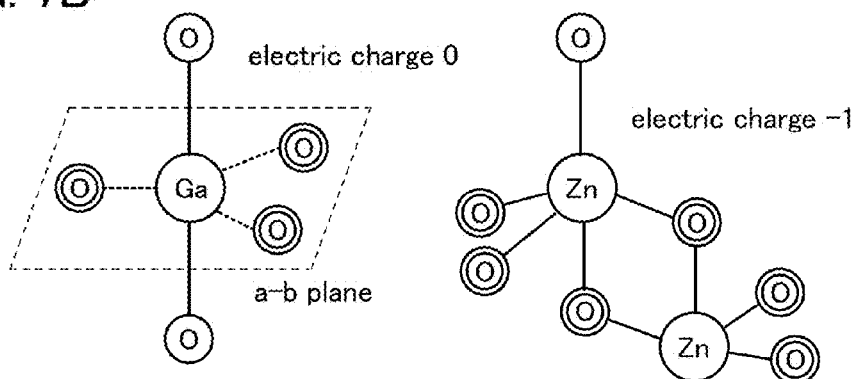
FIG. 7C
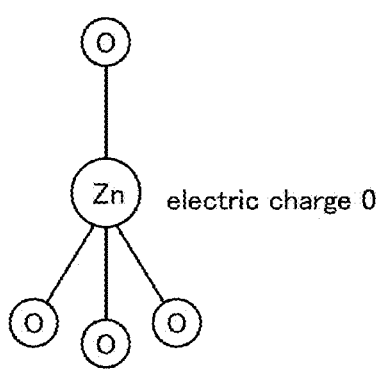

FIG. 8A        FIG. 8B
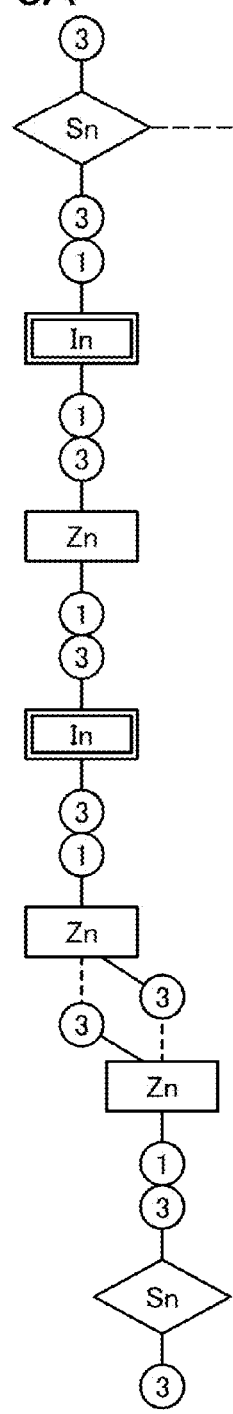
FIG. 8C
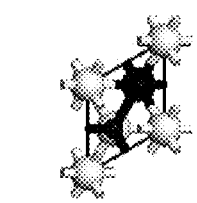
● In
○ Sn
○ Zn
● O ● In ● Ga ● Zn

● O

SEMICONDUCTOR DEVICE AND DRIVING METHOD THEREOF

CROSS-REFERENCE TO RELATED APPLICATIONS

This application is a continuation of U.S. application Ser. No. 13/455,188, filed Apr. 25, 2012, now allowed, which claims the benefit of a foreign priority applications filed in Japan as Serial No. 2011-102567 on Apr. 29, 2011, and Serial No. 2011-112818 on May 19, 2011, all of which are incorporated by reference.

BACKGROUND OF THE INVENTION

1. Field of the Invention

The present invention relates to a semiconductor memory device which includes a circuit including a semiconductor element such as a transistor, and a driving method thereof.

2. Description of the Related Art

A dynamic random access memory (DRAM) is a semiconductor memory device where one bit of data can be stored with use of one transistor and one capacitor. The DRAM has advantages such as a small area per unit memory cell, easiness in integration for modularization, and low manufacturing cost.

The DRAM requires an operation of recharge (refresh) before necessary electric charge is lost. A counter of a memory controller or a microcomputer incorporating a memory controller counts timing for performing a refresh operation, and the refresh operation is performed when the count becomes a predetermined value.

Since frequent refresh operations increase power consumption, reduction of the frequency of the refresh operations has been attempted (see Patent Document 1).

REFERENCE

Patent Document

[Patent Document 1] Japanese Published Patent Application No. H07-254272

SUMMARY OF THE INVENTION

A conventional DRAM needs to perform a refresh operation at an interval of several tens of milliseconds to hold data, which results in large power consumption. In addition, a transistor therein is frequently turned on and off; thus, deterioration of the transistor is a problem. These problems become significant as the memory capacity increases and transistor miniaturization advances.

Thus, an object is to provide a semiconductor memory device with low power consumption in which the frequency of refresh operation for holding data is decreased.

Another object is to provide a semiconductor memory device having a small area and low power consumption.

One embodiment of the present invention is a memory module including a memory cell array including memory cells arranged in matrix, each including a first transistor including an oxide semiconductor and a first capacitor; and a refresh timing detection circuit including a reference cell including a p-channel third transistor, a second capacitor, and a second transistor using an oxide semiconductor, and a comparison circuit including a resistor and a comparator. When a potential is supplied to the first capacitor through the first transistor, the potential is supplied to the second capacitor through the second transistor, and a drain current value of the third transistor is changed in accordance with the potential stored in the second capacitor. When the drain current value of the third transistor is higher than a predetermined value, refresh operations of the memory cell array and the reference cell are performed.

In the memory cell, a drain of the first transistor is connected to one of a pair of electrodes of the first capacitor, and the other of the pair of electrodes of the first capacitor is grounded. Note that a source of the first transistor is connected to a bit line, and a gate of the first transistor is connected to a word line.

In the refresh timing detection circuit, a gate of the third transistor is connected to a drain of the second transistor and one of a pair of electrodes of the second capacitor, a source of the third transistor is connected to a high-level power supply potential (VDD), a drain of the third transistor is connected to one of a pair of electrodes of the resistor and one of a pair of electrodes of the comparator, and the other of the pair of electrodes of the second capacitor and the other of the pair of electrodes of the resistor are grounded. Note that a source of the second transistor is connected to a reference bit line, and the gate of the first transistor is connected to a reference word line.

First, when data1 is written to one of the memory cells included in the memory cell array, a high potential (VH: a potential higher than the sum of the threshold voltage of the first transistor (Vth1) and VDD) is applied to the word line. Next, VDD is applied to the bit line, whereby electric charge corresponding to data1 is stored in the first capacitor.

At this time, data1 is also written to the reference cell. In order that data1 is written to the reference cell, a potential of the reference word line may be set to VH and a potential of the reference bit line may be set to VDD.

When data1 is written to the reference cell, the voltage of the gate of the third transistor is higher than the threshold voltage of the third transistor (Vth2) by electric charge stored in the second capacitor, so that the third transistor is turned off. Therefore, even when the source of the third transistor is set to VDD, the drain current hardly flows. However, when electric charge stored in the second capacitor is gradually lost because of off-state current of the second transistor and a potential of the second capacitor becomes lower than or equal to Vth2, drain current flows through the third transistor.

Here, in the comparison circuit, when a voltage of the resistor is higher than the reference potential (Vref) connected to the other of the pair of electrodes of the comparator, the refresh operation to the memory cell array and the reference cell is performed.

Note that the first transistor and the second transistor have the same structure. Thus, the off-state current of the first transistor is substantially equal to that of the second transistor. That is, time for losing electric charge stored in the first capacitor is equal to the second capacitor. Therefore, by monitoring the change of a drain current value of the third transistor depending on the change of the potential of the second capacitor, timing of losing data1 from the memory cell can be obtained. Therefore, the refresh operation can be performed in advance of the loss of data1.

Further, the reference word line can also serve as the word line. By sharing the reference word line and the word line (or connecting the reference word line and the word line), the number of wirings can be reduced and writing to the memory cell can be done at the same time as writing to the reference cell. Further, the reference bit line can also serve as the bit line. By sharing the reference bit line and the bit line (or connecting the reference bit line and the bit line), the area of the memory module can be reduced.

Note that the third transistor may be omitted, and the second transistor, the second capacitor, and one of the pair of electrodes of the comparator may be directly connected to each other. In that case, when the voltage of the second capacitor is lower than Vref as a result of comparison between the voltage of the second capacitor and Vref which is connected to the other of the pair of electrodes of the comparator, the refresh operation may be performed to the memory cell array and the reference cell.

Further, a capacitance (also referred to as a storage capacitance) of the second capacitor may be smaller than that of the first capacitor. In that case, electric charge of the second capacitor is lost before that of the first capacitor is lost; therefore, the refresh operation is performed surely before electric charge is lost from the first capacitor.

Further, the plurality of reference cells is preferably provided in the refresh timing detection circuit. In the case where the plurality of reference cells is provided, the refresh operation may be performed in accordance with the reference cell in which electric charge is lost the most quickly in the plurality of reference cells. Thus, an influence of a variation in the off-state current of the first transistor and the second transistor which are included in the memory cell and the reference cell respectively is reduced and the refresh operation is performed surely before data1 is lost.

As an oxide semiconductor used for the first transistor and the second transistor, a material whose band gap is greater than or equal to 2.5 eV, preferably greater than or equal to 3.0 eV may be selected. With use of a material with a band gap in the above range, the off-state current of the transistor can be reduced. Note that in one embodiment of the present invention, another material which is not an oxide semiconductor having semiconductor characteristics, and a band gap in the above range may be applied.

It is preferable that the oxide semiconductor be highly purified so as to contain as little impurities (such as hydrogen, an alkali metal, an alkaline earth metal, a rare gas, nitrogen, phosphorus, or boron) causing carriers directly or indirectly as possible. Furthermore, it is preferable to reduce oxygen vacancy as much as possible. By reducing impurities and oxygen vacancy in the oxide semiconductor, generation of carriers in the oxide semiconductor is suppressed, and the off-state current of the transistor can be reduced.

The transistor having a small amount of off-state current as described above is used for the first transistor, whereby retention characteristics of electric charge stored in the first capacitor can be improved, and the frequency of the refresh operation can be reduced.

As a method for reducing the frequency of the refresh operation, the following method is known: a method for forming a memory module which has a structure that a counter of a memory controller or a microcomputer which incorporates a memory controller counts timing, and when the count becomes a predetermined value, the refresh operation is performed. In this case, the number of registers included in the counter becomes enormous, so that the area of the counter in the memory module is increased. Moreover, consumption current is increased due to the operation of the counter.

By applying one embodiment of the present invention, timing of the refresh operation can be detected without using of the counter, and the increase of the area of the memory module and the increase of consumption current can be suppressed.

The frequency of the refresh operations for storing data is reduced, and a semiconductor memory device with low power consumption can be obtained.

Further, it is not necessary to provide a counter which counts timing of the refresh operation for a long time as a refresh timing detection circuit, whereby a semiconductor memory device including a refresh timing detection circuit having a small area and low power consumption can be obtained.

BRIEF DESCRIPTION OF THE DRAWINGS

In the accompanying drawings:

FIGS. 7A to 7E each illustrate a structure of an oxide material according to one embodiment of the present invention;

FIGS. 8A to 8C illustrate a structure of an oxide material according to one embodiment of the present invention;

DETAILED DESCRIPTION OF THE INVENTION

Figure 1:
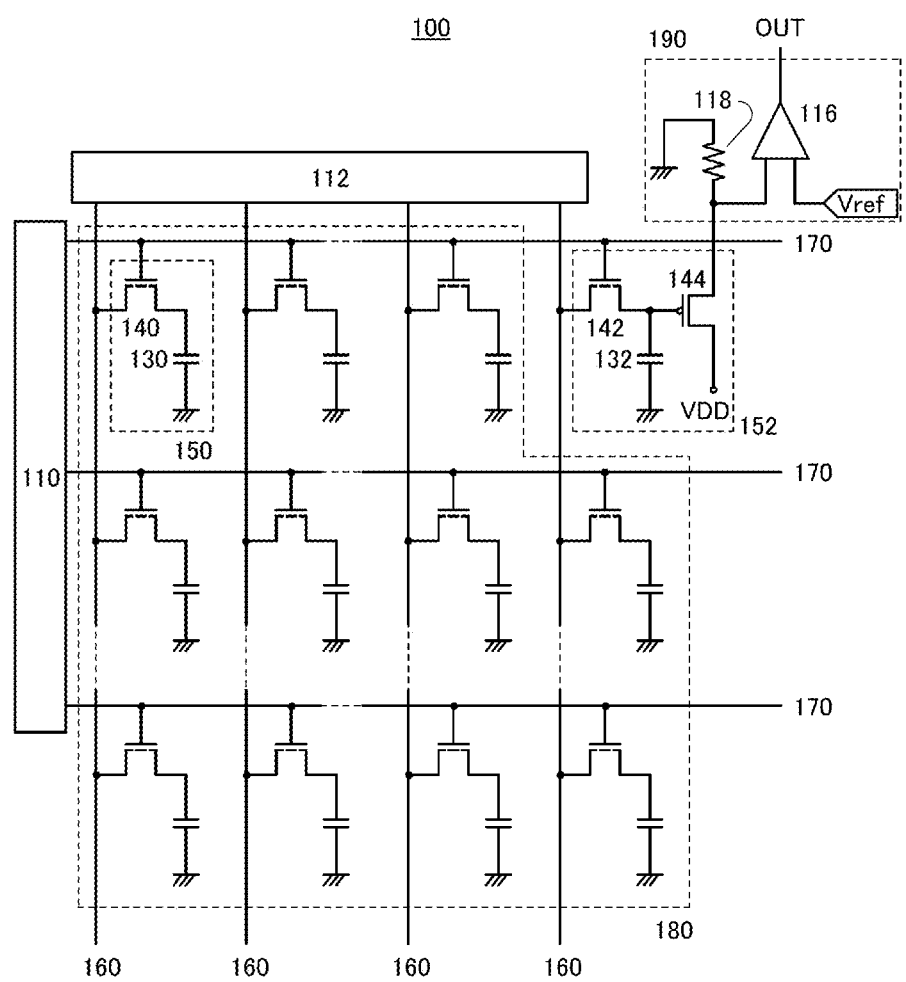
FIG. 1 illustrates an example of a semiconductor memory device which is one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

In this specification, when one of a source or a drain of a transistor is called drain, the other is called source. That is, a source and a drain of a transistor are not distinguished depending on the potential level. Therefore, a portion called a source in this specification can be alternatively referred to as a drain.

Note that voltage refers to a potential difference between a predetermined potential and a reference potential (e.g., a ground potential) in many cases. Accordingly, a voltage can also be called a potential. Further, even when a potential is referred to as a potential VH, a potential VDD, a potential GND, or the like, the potentials do not represent a potential VH, a potential VDD, or a potential GND respectively in a strict sense. Therefore, a potential VH, a potential VDD, and a potential GND can be replaced with a potential close to a potential VH, a potential close to a potential VDD, and a potential close to a potential GND, respectively. Note that "to be grounded" is synonymous with "to be connected to GND".

Even when it is written in this specification that "to be connected", there is a case in which no physical connection is made in an actual circuit and a wiring is only extended.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, a semiconductor memory device according to one embodiment of the present invention will be described.

FIG. 1 is a circuit diagram of a memory module 100 which is a semiconductor memory device.

The memory module 100 includes a memory cell array 180 including a plurality of memory cells 150 arranged in matrix, a refresh timing detection circuit including a reference cell 152 and a comparison circuit 190, a row decoder 110, a column decoder 112, bit lines 160, and word lines 170.

The memory cell 150 includes a first transistor 140 using an oxide semiconductor and a first capacitor 130. With the use of an oxide semiconductor, the off-state current of the first transistor 140 can be reduced.

In this specification, in order to distinguish a transistor formed using an oxide semiconductor from the other transistors, a signal shown as the first transistor 140 in FIG. 1 and the like is used as a transistor using an oxide semiconductor.

The reference cell 152 includes a third transistor 144 having a p-type channel, a second transistor 142 formed using an oxide semiconductor, and a second capacitor 132. The second transistor 142 has the same structure as the first transistor 140. The second transistor 142 may have the same oxide semiconductor film as the first transistor 140. The capacitance of the second capacitor 132 is preferably less than or equal to that of the first capacitor 130.

The comparison circuit 190 includes a resistor 118 and a comparator 116.

The row decoder 110 includes a plurality of word lines 170, and the column decoder 112 includes a plurality of bit lines 160.

In each of the memory cells 150, a gate of the first transistor 140 is connected to the word line 170, a source of the first transistor 140 is connected to the bit line 160, a drain of the first transistor 140 is connected to one of a pair of electrodes of the first capacitor 130, and the other of the pair of electrodes of the first capacitor 130 is connected to GND.

In the reference cell 152, a gate of the second transistor 142 is connected to the word line 170, a source of the second transistor 142 is connected to the bit line 160, a drain of the second transistor 142 is connected to one of a pair electrodes of the second capacitor 132 and a gate of the third transistor 144, the other of the pair of electrodes of the second capacitor 132 is connected to GND, and a source of the third transistor 144 is connected to a high-level power supply potential (VDD).

In the comparison circuit 190, one of the pair of electrodes of the resistor 118 is connected to a drain of the third transistor 144 and one of the pair of electrodes of the comparator 116, the other of the pair of electrodes of the resistor 118 is connected to GND, and the other of the pair of electrodes of the comparator 116 is connected to a reference potential (Vref).

The above-described refresh timing detection circuit is not provided with a counter having many registers, whereby an area of the memory module can be reduced.

A method for writing data to the memory cell array 180 will be described. Data writing is performed on every memory cell 150. Specifically, a potential of the word line 170 in the row which is selected arbitrarily is set to VH (a potential higher than the sum of the threshold voltage (Vth) of the first transistor 140 and VDD), and potentials of the word lines 170 in the other rows is set to GND (or lower than GND). Next, a potential of the bit line 160 in the column which is selected arbitrarily is set to VDD, and the bit lines 160 in the other columns is set to a floating potential (float). As a result, VDD is stored in the first capacitor 130 in the memory cell 150 in the selected row which is connected to the bit line 160 in the selected column. Next, the potential of the word line 170 in the selected row is set to GND (or lower than GND), whereby data is stored in the memory cell 150. Data is sequentially written to different memory cells 150. One of methods for writing data to the memory cell array 180 is described above.

When data is written to the first row, the potential of the word line 170 connected to the reference cell 152 is set to VH, the potential of the bit line 160 connected to the reference cell 152 is set to VDD, and VDD is stored in the second capacitor 132.

In this embodiment, the word line and the bit line which are connected to the reference cell 152 also serve as the word line 170 and the bit line 160 which are connected to the memory cell 150, respectively; however, the present invention is not limited thereto, a reference word line and a reference bit line which are different systems from the memory cell array 180 may be used in connection with the reference cell 152. Alternatively, the memory cell connected to the reference cell 152 through the word line 170 may be used as a dummy cell.

Low off-state current of the first transistor 140 enables data written to the memory cell array 180 in this manner to be stored for a long time.

Low off-state current of the first transistor 140 also enables electric charge to be stored in the first capacitor 130 even when supply of a power supply potential is stopped. Therefore, the memory module 100 can reduce power consumption.

However, electric charge stored in the first capacitor 130 is lost gradually by a minute amount of off-state current of the first transistor 140 in principle, and data written to the memory cell 150 is no longer stored.

At the same time, in the reference cell 152, electric charge stored in the second capacitor 132 is also lost by off-state current of the second transistor 142. When a higher potential than the threshold voltage of the third transistor 144 (Vth2) is stored in the second capacitor 132, the third transistor 144 is turned off. On the other hand, when electric charge in the second capacitor 132 is lost and the potential of the second capacitor 132 is lower than or equal to Vth2, the third transistor 144 is turned on and drain current flows.

Drain current refers to a current which flows from a source to a drain through a channel in a transistor. In an n-channel transistor, the drain current flows when a gate voltage is higher than or equal to the threshold voltage thereof, and in a p-channel transistor, the drain current flows when a gate voltage is lower than or equal to the threshold voltage thereof. The gate voltage refers to a potential difference between a source and a gate when the potential of the source is used as a reference potential.

The drain current of the third transistor 144 flows through the resistor 118 and a voltage (VR) in accordance with the resistances of the resistor 118 is applied to one of the pair of electrodes of the comparator 116. When VR is higher than Vref connected to the other of the pair of electrodes of the comparator 116, the comparator 116 generates a signal for performing refresh operation, and the refresh operation is performed to the memory cell array 180 and the reference cell 152.

At this time, the drain current value is determined by the sum of an on-state resistance of the third transistor 144 and a resistance of the resistor 118. Therefore, the resistance of the resistor 118 is set to high so as not to cause a problem in the operation of the comparator 116, whereby a voltage divider of the resistor 118 can be higher than that between the source and the drain of the third transistor 144. As a result, the size of the third transistor 144 can be reduced. Therefore, reduction in the memory module 100 can be achieved.

In the reference cell 152, electric charge can also be stored in a state where supply of the power supply potential is stopped. That is, in the memory module 100, the timing of the refresh operation is not deviated even when there is a period in which the power supply potential is not supplied when data is retained.

Then, a method for reading data will be described. Data reading is performed on every memory cell 150. First, the potential of the bit line 160 in the arbitrarily selected column which is selected arbitrarily is set to a predetermined potential (a fixed potential). Next, the potential of the word line 170 in the row which is selected arbitrarily is set to VH, whereby a potential corresponding to data written to the first capacitor 130 is given to the bit line 160 which is selected. After that, the given potential is read by a sense amplifier (not illustrated). Note that data is lost at the same time data is read. However, the operation of the sense amplifier amplifies the voltage, so that data is written to the memory cell 150 again. Data is sequentially read by different memory cells 150. As described above, data is read by the memory cell array 180.

Figure 4A:
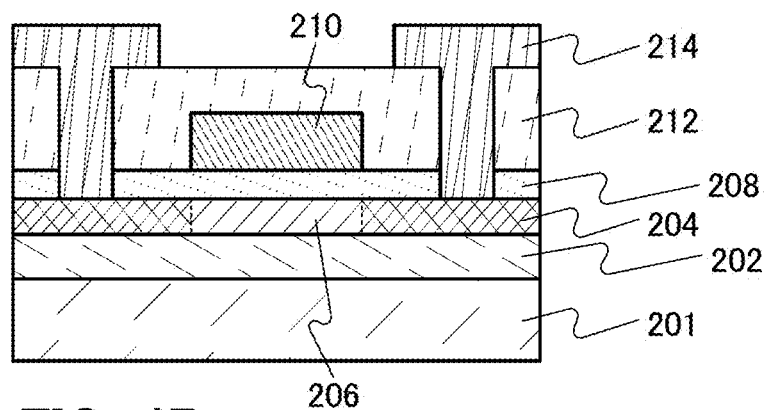
FIGS. 4A and 4B are cross-sectional views each illustrating a structural example of a transistor included in a semiconductor memory device which is one embodiment of the present invention.
Figure 4B:
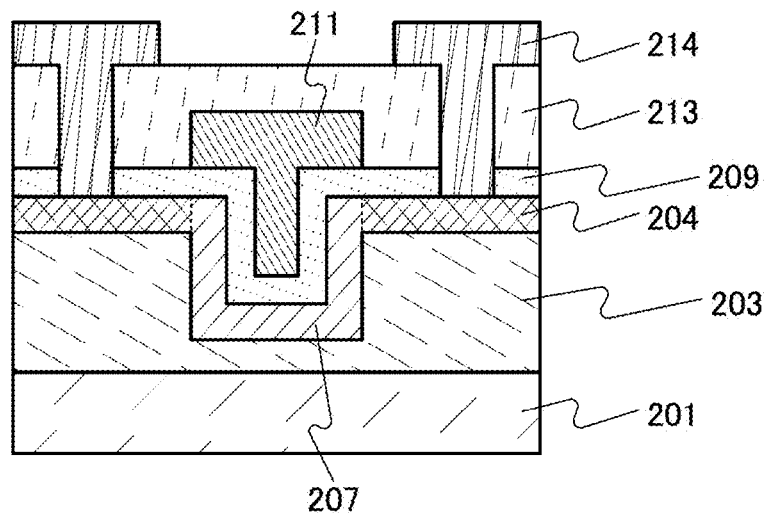

Next, a structural example of a transistor which can be used for the first transistor 140 and the second transistor 142 is illustrated in FIGS. 4A and 4B.

FIG. 4A is an example of a coplanar transistor.

A transistor illustrated in FIG. 4A includes a base insulating film 202 provided over a substrate 201, an oxide semiconductor film including a low-resistance region 204 and a high-resistance region 206 provided over the base insulating film 202, a gate insulating film 208 provided to cover the oxide semiconductor film, a gate electrode 210 overlapping with the high-resistance region 206 with the gate insulating film 208 provided therebetween, an interlayer insulating film 212 provided to cover the gate insulating film 208 and the gate electrode 210, and a pair of electrodes 214 over the interlayer insulating film 212 and in contact with the low-resistance region 204 through an opening provided in the interlayer insulating film 212.

The oxide semiconductor film has a thickness from 1 nm to 40 nm, and preferably from 5 nm to 15 nm. In particular, in a transistor whose channel length is less than or equal to 30 nm, by setting the thickness of the oxide semiconductor film to be approximately 5 nm, a short channel effect can be suppressed and the transistor has stable electrical characteristics.

An oxide semiconductor preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn—O-based oxide" means an oxide containing In, Ga, and Zn as its main component and there is no particular limitation on the ratio of In, Ga, and Zn. The In—Ga—Zn-based oxide may contain a metal element other than the In, Ga, and Zn.

In the case where an In—Zn-based oxide material is used for the oxide semiconductor film, any of the following is employed: In/Zn is greater than or equal to 0.5 and less than or equal to 50 in an atomic ratio, preferably In/Zn is greater than or equal to 1 and less than or equal to 20 in an atomic ratio, or further preferably In/Zn is greater than or equal to 1.5 and less than or equal to 15 in an atomic ratio. When the atomic ratio of Zn is in the above range, the field-effect mobility of the transistor can be improved. Here, when the atomic ratio of the compound is In:Zn:O=X:Y:Z, the relation of Z>1.5X+Y is preferably satisfied.

Alternatively, a material represented by a chemical formula, $InMO_3(ZnO)_m$ (m>0) may be used as the oxide semiconductor film. Here, M represents one or more metal elements selected from Zn, Ga, Al, Mn, and Co. For example, M may be Ga, Ga and Al, Ga and Mn, Ga and Co, or the like.

For example, an In—Ga—Zn-based oxide with an atomic ratio of In:Ga:Zn=1:1:1 or In:Ga:Zn=2:2:1, or any of oxides whose composition is in the neighborhood of the above compositions can be used. Alternatively, an In—Sn—Zn-based oxide with an atomic ratio of In:Sn:Zn=1:1:1, In:Sn:Zn=2:1:3, or In:Sn:Zn=2:1:5, or any of oxides whose composition is in the neighborhood of the above compositions may be used.

However, without limitation to the materials given above, a material with an appropriate composition may be used depending on needed semiconductor characteristics (e.g., field-effect mobility, the threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high field-effect mobility can be obtained relatively easily in the case of using an In—Sn—Zn oxide. However, field-effect mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the formula represented by Formula 1. For example, r may be 0.05. The same applies to other oxides.

[FORMULA 1]

$$(a-A)^2+(b-B)^2+(c-C)^2 \leq r^2 \quad (1)$$

The oxide semiconductor may be either single crystal or non-single-crystal. In the latter case, the oxide semiconductor may be either amorphous or polycrystal. Further, the oxide semiconductor does not necessarily have a completely amorphous structure and may include a crystalline region in an amorphous structure.

In the case of an oxide semiconductor in an amorphous state, a flat surface can be obtained relatively easily, so that when a transistor is manufactured with the use of such an oxide semiconductor film, interface scattering can be reduced, and relatively high field-effect mobility can be obtained relatively easily.

A material whose band gap is greater than or equal to 2.5 eV, preferably greater than or equal to 3.0 eV, is used for the oxide semiconductor film in order to reduce the off-state current of the transistor. Instead of the oxide semiconductor film, a material having semiconductor characteristics whose band gap is in the above-described range may also be used.

In the oxide semiconductor film, hydrogen, an alkali metal, an alkaline earth metal, and the like are reduced and the concentration of impurities is very low. Therefore, in a transistor whose channel region is formed using an oxide semiconductor film, off-state current can be reduced.

The concentration of hydrogen in the oxide semiconductor film is lower than $5 \times 10^{19}$ atoms/cm, preferably lower than or equal to $5 \times 10^{18}$ atoms/cm, more preferably lower than or equal to $1 \times 10^{18}$ atoms/cm, still more preferably lower than or equal to $5 \times 10^{17}$ atoms/cm.

An alkali metal is not an element composed of an oxide semiconductor, and therefore, is an impurity. Also, an alkaline earth metal is also an impurity in the case where the alkaline earth metal is not composed of an oxide semiconductor. An alkali metal, in particular, Na becomes Na$^+$ when an insulating film in contact with the oxide semiconductor film is an oxide film and Na diffuses into the insulating layer. In addition, in the oxide semiconductor film, Na cuts or enters a bond between a metal and oxygen which are included in the oxide semiconductor. As a result, for example, deterioration of characteristics of the transistor such as a normally-on state of the transistor due to shift of the threshold voltage in the negative direction or a reduction in field-effect mobility occurs; in addition, variation in characteristics is also caused. Such deterioration of characteristics of the transistor and variation in characteristics due to the impurity remarkably appear when the concentration of hydrogen in the oxide semiconductor film is sufficiently low. Therefore, when the concentration of hydrogen in the oxide semiconductor film is less than or equal to $1 \times 10^{18}$ atoms/cm, preferably less than or equal to $1 \times 10^{17}$ atoms/cm, the concentration of impurity is preferably reduced. Specifically, the measurement value of Na concentration is lower than or equal to $5 \times 10^{16}$ atoms/cm, preferably lower than or equal to $1 \times 10^{16}$ atoms/cm, more preferably lower than or equal to $1 \times 10^{15}$ atoms/cm. In addition, the measurement value of lithium (Li) concentration is preferably $5 \times 10^{15}$ atoms/cm or less, more preferably $1 \times 10^{15}$ atoms/cm or less. In addition, the measurement value of potassium (K) concentration is preferably less than or equal to $5 \times 10^{15}$ atoms/cm, more preferably less than or equal to $1 \times 10^{15}$ atoms/cm.

With the use of the above-described oxide semiconductor film as the semiconductor film, off-state current of a transistor can be reduced. In particular, the off-state current of the transistor can be less than or equal to $1 \times 10^{-18}$ A, less than or equal to $1 \times 10^{-21}$ A, or less than or equal to $1 \times 10^{-24}$ A. Therefore, the memory cell which has excellent data retention and low power consumption can be manufactured.

The oxide semiconductor film is in a single crystal state, a polycrystalline (also referred to as polycrystal) state, an amorphous state, or the like.

The oxide semiconductor film is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts and amorphous portions are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Note that part of oxygen included in the oxide semiconductor film may be substituted with nitrogen.

The c-axes of individual crystal part included in the CAAC-OS film may be aligned in a certain direction (e.g., a direction perpendicular to a surface of a substrate over which the CAAC-OS film is formed or a surface of the CAAC-OS film). Alternatively, the normals of the a-b planes of the individual crystal part included in the CAAC-OS film may be aligned in a certain direction (e.g., a direction perpendicular to a surface of a substrate over which the CAAC-OS film is formed or a surface of the CAAC-OS film).

The CAAC-OS film becomes a conductor, a semiconductor, or an insulator depending on its composition or the like. Further, the CAAC-OS film transmits or does not transmit visible light depending on its composition or the like.

An example of such a CAAC-OS film is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal part of the CAAC-OS film will be described in detail with reference to FIGS. 7A to 7E, FIGS. 8A to 8C, and FIGS. 9A to 9C. In FIGS. 7A to 7E, FIGS. 8A to 8C, and FIGS. 9A to 9C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane. Furthermore, in FIGS. 7A to 7E, O surrounded by a circle represents tetracoordinate O and O surrounded by a double circle represents tricoordinate O.

FIG. 7A illustrates a structure including one hexacoordinate In atom and six tetracoordinate oxygen (hereinafter referred to as tetracoordinate O) atoms proximate to the In atom. Here, a structure including one In and oxygen atoms proximate thereto is referred to as a subunit. The structure in FIG. 7A is actually an octahedral structure, but is illustrated as a planar structure for simplicity. Note that three tetracoordinate O atoms exist in each of an upper half and a lower half in FIG. 7A. In the subunit illustrated in FIG. 7A, electric charge is 0.

FIG. 7B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 7B. An In atom can also have the structure illustrated in FIG. 7B because an In atom can have five ligands. In the subunit illustrated in FIG. 7B, electric charge is 0.

FIG. 7C illustrates a structure including one tetracoordinate Zn atom and four tetracoordinate O atoms proximate to the Zn atom. In FIG. 7C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 7C. In the subunit illustrated in FIG. 7C, electric charge is 0.

FIG. 7D illustrates a structure including one hexacoordinate Sn atom and six tetracoordinate O atoms proximate to the Sn atom. In FIG. 7D, three tetracoordinate O atoms exist in each of an upper half and a lower half. In the subunit illustrated in FIG. 7D, electric charge is +1.

FIG. 7E illustrates a subunit including two Zn atoms. In FIG. 7E, one tetracoordinate O atom exists in each of an upper half and a lower half. In the subunit illustrated in FIG. 7E, electric charge is −1.

Here, a group of some subunits is referred to as one group, and one cycle of a plurality of groups is referred to as one unit.

Now, a rule of bonding between the subunits will be described. The three O atoms in the upper half with respect to the hexacoordinate In atom in FIG. 7A each have three proximate In atoms in the downward direction, and the three O atoms in the lower half each have three proximate In atoms in the upward direction. The one O atom in the upper half with respect to the pentacoordinate Ga atom in FIG. 7B has one proximate Ga atom in the downward direction, and the one O atom in the lower half has one proximate Ga atom in the upward direction. The one O atom in the upper half with respect to the tetracoordinate Zn atom in FIG. 7C has one proximate Zn atom in the downward direction, and the three O atoms in the lower half each have three proximate Zn atoms in the upward direction. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of subunits including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, one group can be formed in a different manner by combining subunits so that the total electric charge of the layered structure is 0.

FIG. 8A illustrates a model of one group included in a layered structure of an In—Sn—Zn—O-based material. FIG. 8B illustrates a unit including three groups. Note that FIG. 8C illustrates an atomic arrangement in the case where the layered structure in FIG. 8B is observed from the c-axis direction.

In FIG. 8A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 8A, one tetracoordinate O atom existing in each of an upper half and a lower half with respect to an In atom is denoted by circled 1. FIG. 8A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the group included in the layered structure of the In—Sn—Zn—O-based material in FIG. 8A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a subunit that includes two Zn atoms and is proximate to one tetracoordinate O atom in an upper half, and the subunit is bonded to a Sn atom proximate to three tetracoordinate O atoms in each of an upper half and a lower half through one tetracoordinate O atom in a lower half with respect to the subunit. A plurality of such groups is bonded, so that a unit which is one cycle is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a subunit including a Sn atom is +1. Therefore, electric charge of −1, which cancels +1, is needed to form a layered structure including a Sn atom. As a structure having electric charge of −1, the subunit including two Zn atoms as illustrated in FIG. 7E can be given. For example, with one subunit including two Zn atoms, electric charge of one subunit including a Sn atom can be cancelled, so that the total electric charge of the layered structure can be 0.

An In atom can have either five ligands or six ligands. Specifically, when a unit in which one cycle illustrated in FIG. 8B is repeated is formed, an In—Sn—Zn-based oxide ($In_2SnZn_3O_8$) crystal can be obtained. Note that a layered structure of the obtained In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, and a Sn—Al—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, and an In—Ga-based oxide; and the like.

Figure 9A:
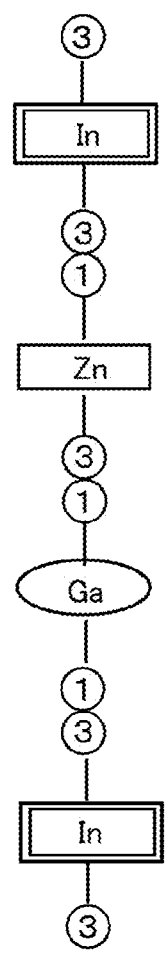
FIGS. 9A to 9C illustrate a structure of an oxide material according to one embodiment of the present invention.

As an example, FIG. 9A illustrates a model of one group included in a layered structure of an In—Ga—Zn-based oxide.

In the group included in the layered structure of the In—Ga—Zn-based oxide in FIG. 9A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such groups is bonded, so that a unit which is one cycle is formed.

Figure 9B:
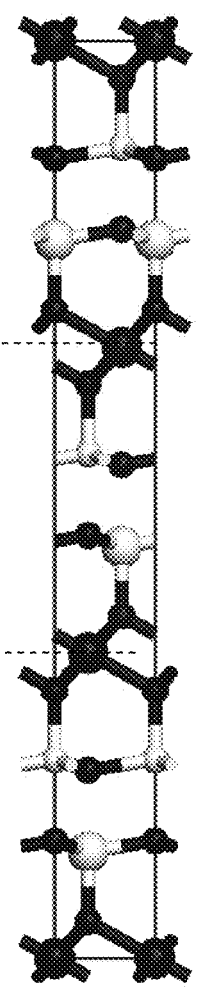
Figure 9C:
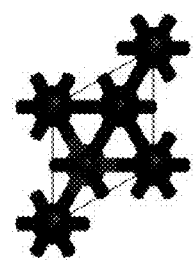

FIG. 9B shows a unit formed of three groups. Note that FIG. 9C illustrates an atomic arrangement in the case where the layered structure in FIG. 9B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a subunit including any of an In atom, a Zn atom, and a Ga atom is 0. As a result, the total electric charge of a group having a combination of such subunits is always 0.

In order to form the layered structure of the In—Ga—Zn-based oxide, a unit can be formed using not only the group illustrated in FIG. 9A but also a group in which the arrangement of the In atom, the Ga atom, and the Zn atom is different from that in FIG. 9A.

A CAAC-OS film is easily formed when a base film is flat. Specifically, the base film is formed such that the average surface roughness ($R_a$) is less than or equal to 1 nm, preferably less than or equal to 0.3 nm. Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the following formula represented by Formula 2 below.

[FORMULA 2]

$$Ra = \frac{1}{S_0} \int_{y_1}^{y_2} \int_{x_1}^{x_2} |f(x, y) - Z_0| dx dy \qquad (2)$$

Note that in Formula 2, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

The oxide semiconductor film may be formed by a sputtering method, an evaporation method, a plasma chemical vapor deposition method (PCVD method), a pulsed laser deposition method (PLD method), an atomic layer deposition method (ALD method), or a molecular beam epitaxy method (MBE method). At this time, the oxide semiconductor film is formed while the heat treatment at a temperature higher than or equal to 250° C. and lower than or equal to 450° C. is performed, whereby a CAAC-OS film is easily formed. Alternatively, after the oxide semiconductor film is formed, the heat treatment at a temperature higher than or equal to 450° C. and lower than the strain point of the substrate, preferably higher than or equal to 600° C. and lower than or equal to 700° C. may be performed.

For example, when the oxide semiconductor film is formed by a sputtering method, evacuation of a deposition chamber where the oxide semiconductor film is formed is preferably performed with a rough vacuum pump, such as a dry pump, and a high vacuum pump, such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Moreover, combination of the turbo molecular pump and a cryopump having a high capability in evacuating water or a sputter ion pump having a high capability in evacuating hydrogen is effective.

Because it is adsorbed, an adsorbate present in the film formation chamber where an oxide semiconductor film is formed, does not affect the pressure in the film formation chamber, but the adsorbate leads to release of gas at the time of the evacuation of the film formation chamber. Therefore, it is important that the adsorbate present in the film formation chamber be desorbed as much as possible and evacuation be performed in advance with use of a pump having high evacuation capability. Note that the film formation chamber may be subjected to baking for promotion of desorption of the adsorbate. By the baking, the rate of desorption of the adsorbate can be increased about tenfold. The baking should be performed at a temperature greater than or equal to 100° C. and less than or equal to 450° C. At this time, when the adsorbate is removed while an inert gas is introduced, the rate of desorption of water or the like, which is difficult to desorb only by evacuation, can be further increased. Note that the rate of desorption of the adsorbate can be further increased by heating of the inert gas to be introduced at substantially the same temperature as the temperature of the baking. In addition, the rate of desorption of the adsorbate can be further increased also by dummy film formation performed at the same time as the baking. Here, the dummy film formation refers to film formation on a dummy substrate by sputtering, in which a film is deposited on the dummy substrate and the inner wall of a film formation chamber so that impurities in the film formation chamber and an adsorbate on the inner wall of the film formation chamber are confined in the film. For the dummy substrate, a material from which the released gas is in a smaller amount is preferably used, and for example, the same material as that of the substrate 201 may be used.

Moreover, when a deposition gas with a dew point lower than or equal to −95° C., preferably lower than or equal to −110° C. is used, the concentration of hydrogen in the oxide semiconductor film can be reduced.

Hydrogen entry into an oxide semiconductor film can be suppressed by formation of the oxide semiconductor film in this manner. Furthermore, hydrogen entry into the oxide semiconductor film from a film in contact therewith can be suppressed by use of the similar film formation chamber for formation of the film in contact with the oxide semiconductor film. Consequently, a transistor with high reliability and less variation in electrical characteristics can be manufactured.

In the oxide semiconductor film, the low-resistance region 204 and the high-resistance region 206 are provided by using the gate electrode 210 as a mask, and adding an impurity which has a function of reducing the resistance of the oxide semiconductor film through the gate insulating film 208. Specifically, by adding phosphorus, nitrogen, or a rare gas (helium, neon, argon, krypton, xenon, or the like), the resistance of the oxide semiconductor film is reduced and the low-resistance region 204 is formed. At the same time, the region other than the low-resistance region 204 has a relatively high resistance, so that the high-resistance region 206 is formed.

At least enough heat resistance to withstand later-performed heat treatment is necessary, although there is no particular limitation on the substrate 201. As the substrate 201, for example, a glass substrate, a ceramic substrate, a quartz substrate, a sapphire substrate, or the like may be used. Any of the following substrates can also be used: a single crystal semiconductor substrate or a polycrystalline semiconductor substrate made of silicon, silicon carbide, germanium, or the like; a compound semiconductor substrate made of silicon germanium or the like; and a semiconductor substrate such as an SOI (silicon on insulator) substrate; and the like. Any of these substrates further provided with a semiconductor element may be used as the substrate 201.

As the substrate 201, a flexible substrate may be used. In that case, a transistor is formed directly on the flexible substrate. Note that to provide a transistor on the flexible substrate, there is also a method in which a transistor is formed over a non-flexible substrate, and the transistor is then separated and transferred to the substrate 201 which is a flexible substrate. In that case, a separation is preferably provided between the flexible substrate and the transistor.

The base insulating film 202 may be formed as a single layer or a stacked layer using at least one of the following materials: silicon oxide, silicon oxynitride, silicon nitride oxide, silicon nitride, aluminum oxide, aluminum nitride, hafnium oxide, zirconium oxide, yttrium oxide, lanthanum oxide, cesium oxide, tantalum oxide, and magnesium oxide. In the case where the surface condition of the substrate 201 is sufficiently clean, the base insulating film 202 is not necessarily provided.

The gate electrode 211 may be formed to have a single-layer structure or a stacked-layer structure using one or more kinds of the following materials: Al, Ti, Cr, Co, Ni, Cu, Y, Zr, Mo, Ag, Ta, and W, a nitride of any of these elements, an oxide of any of these elements, and an alloy of any of these elements.

The gate insulating film 208 may be formed using a method and a material that are similar to those of the base insulating film 202.

The pair of electrodes 214 may be formed using a method and a material that are similar to those of the gate electrode 211.

The interlayer insulating film 212 may be formed using a method and a material that are similar to those of the base insulating film 202.

An insulating film from which oxygen is released by heat treatment is preferably used as at least one of the base insulating film 202 and the gate insulating film 208. When a film that is in contact with the oxide semiconductor film is an insulating film from which oxygen is released by heat treatment, oxygen deficiency generated in the oxide semiconductor film and in the vicinity of the interface of the oxide semiconductor film can be repaired and deterioration in electrical characteristics of the transistor can be suppressed.

To release oxygen by heat treatment means that the released amount of oxygen which is converted into oxygen atoms is estimated to be greater than or equal to $1.0 \times 10^{18}$ atoms/cm$^3$, or greater than or equal to $3.0 \times 10^{20}$ atoms/cm$^3$ in thermal desorption spectroscopy (TDS).

Here, a method for measuring the amount of released oxygen using TDS analysis is described.

The total amount of released gases in TDS analysis is proportional to the integral value of intensity of ions of the released gases, and the total amount of released gases can be calculated by the comparison between the integral value of a measured sample and that of a standard sample.

For example, the number of released oxygen molecules ($N_{O2}$) from an insulating film can be found according to the formula represented by the following Formula 3 with the TDS analysis results of a silicon wafer containing hydrogen at a predetermined density which is the standard sample and the TDS analysis results of the insulating film. Here, all gases having a mass number of 32 which are obtained in the TDS analysis are assumed to originate from an oxygen molecule. CH$_3$OH, which is a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either, because the proportion of such a molecule in the natural world is minimal.

[FORMULA 3]

$$N_{O2} = N_{H2}/S_{H2} \times S_{O2} \times \alpha \quad (3)$$

$N_{H2}$ is the value obtained by conversion of the number of hydrogen molecules released from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient affecting the ion intensity in the TDS analysis. Refer to Japanese Published Patent Application No. H6-275697 for details of Formula 3. Note that the amount of released oxygen from the above insulating film is measured with a thermal desorption spectroscopy apparatus produced by ESCO Ltd., EMD-WA1000S/W using a silicon wafer containing a hydrogen atom at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that since the above α includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen converted into oxygen atoms is twice the number of the released oxygen molecules.

In the above structure, the film from which oxygen is released by heat treatment may be oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the base insulating film 202 and the gate insulating film 208 to the oxide semiconductor film, the interface state density at the interface between the oxide semiconductor film and the base insulating film 202 or the interface state density at the interface between the oxide semiconductor film and the gate insulating film 208 can be reduced. As a result, carrier trapping, occurring due to an operation of the transistor or the like, at the interface between the oxide semiconductor film and the base insulating film 202 or at the interface between the oxide semiconductor film and the gate insulating film 208 can be suppressed, and thus, a transistor with less deterioration in electric characteristics can be obtained.

Further, in some cases, electric charge is generated owing to oxygen deficiency in the oxide semiconductor film. In general, part of oxygen deficiency in the oxide semiconductor film serves as a donor to release an electron which is a carrier. As a result, the threshold voltage of the transistor shifts in the negative direction. In view of this, when oxygen is sufficiently supplied from the base insulating film 202 and the gate insulating film 208 to the oxide semiconductor film, oxygen deficiency in the oxide semiconductor film, which causes the negative shift of the threshold voltage, can be reduced.

FIG. 4B is an example of a trench transistor.

A transistor illustrated in FIG. 4B includes a base insulating film 203 which has a groove portion and is provided over a substrate 201, an oxide semiconductor film including a low-resistance region 204 provided over the base insulating film 203 and a high-resistance region 207 provided along the groove portion of the base insulating film 203, a gate insulating film 209 provided to cover the oxide semiconductor film, a gate electrode 211 overlapping with the high-resistance region 207 with the gate insulating film 209 provided therebetween, an interlayer insulating film 213 provided to overlap with the gate insulating film 209 and the gate electrode 211, and a pair of electrodes 214 in contact with the low-resistance region 204 through an opening provided in the interlayer insulating film 213.

Here, the base insulating film 203, the high-resistance region 207, the gate insulating film 209, the gate electrode 211, and the interlayer insulating film 213 may be formed using a method and a material that are similar to those of the base insulating film 202, the high-resistance region 206, the gate insulating film 208, the gate electrode 210, and the interlayer insulating film 212, respectively.

In the trench transistor, a channel is formed along a groove portion provided in the base insulating film 203, so that an effective channel length can be longer than an apparent channel length of the transistor viewed from the above. Therefore, in the case where the trench transistor has the same area as the coplanar transistor, the short channel effect can be suppressed. However, the structure of the trench transistor is complicated as compared to the coplanar transistor and on-state current is reduced because the effective channel length is long; therefore, the transistors are preferably selected depending on the usage.

Although not illustrated, films included in the transistors illustrated in FIG. 4A and FIG. 4B may have tapered shapes. With the tapered shapes, coverage of each film is improved, and leakage current generated by poor coverage of the film can be reduced.

Note that the third transistor 144 may be formed using a semiconductor substrate or the like exemplified as the substrate 201. Alternatively, the third transistor 144 may be formed using an amorphous silicon film, a microcrystalline silicon film, or a polycrystalline silicon film which is provided over the substrate having an insulating surface.

In this embodiment, a p-channel transistor is used as an example for the third transistor 144, but the transistor is not particularly limited thereto. An n-channel transistor may be used for the third transistor 144. In that case, the third transistor 144 is turned on when the potential of the second capacitor 132 is VDD. Therefore, data is written to the memory cell array 180 and electric charge stored in the second capacitor 132 is lost gradually, so that the drain current value of the third transistor 144 is decreased. Accordingly when the potential of the second capacitor 132 is lower than or equal to V2 (higher than or equal to Vth and lower than VDD), that is, when VR is higher than or equal to Vref, the refresh operation is performed to the memory cell 150 and the reference cell 152.

As the third transistor 144, a transistor similar to the first transistor 140 and the second transistor 142 may be used.

Figure 10:
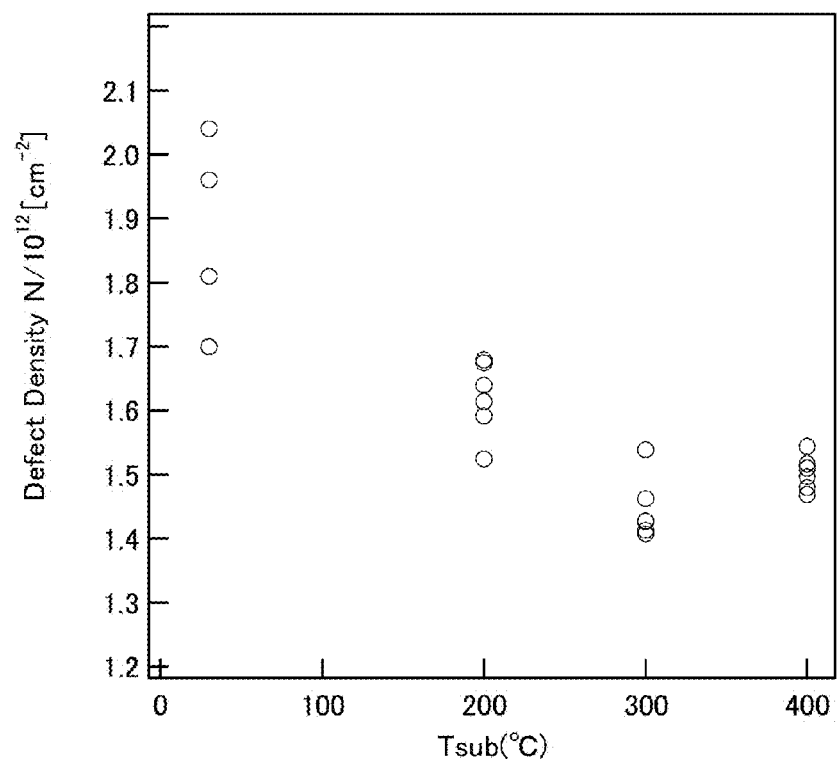
FIG. 10 shows a relation between a film formation temperature and a defect density of an oxide semiconductor.
Figure 11:
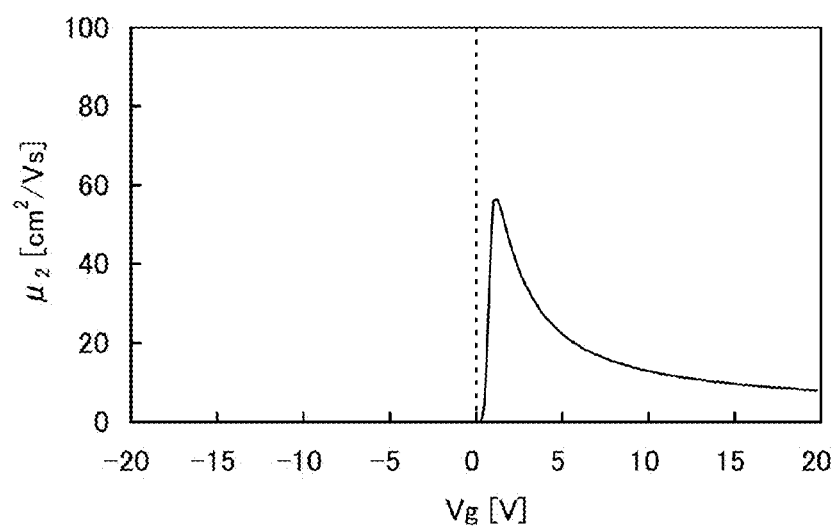
FIG. 11 shows field-effect mobility of an ideal transistor using an oxide semiconductor.

With reference to FIGS. 10 and 11, the field-effect mobility of a transistor will be described.

The actually measured field-effect mobility of a transistor can be lower than its original (or intrinsic) field-effect mobility because of a variety of reasons; this phenomenon occurs not only in the case of using an oxide semiconductor film. The field-effect mobility is decreased partly because a defect is formed inside a semiconductor or at an interface between the semiconductor and an insulating film. In this embodiment, a Levinson model is used, and the field-effect mobility on the assumption that no defect exists inside the semiconductor can be calculated theoretically.

Assuming that the original field-effect mobility of a transistor is $\mu_0$ and a potential barrier (such as a grain boundary) exists in the semiconductor, the measured field-effect mobility $\mu$ can be expressed as the following Formula 4.

[FORMULA 4]

$$\mu = \mu_0 \exp\left(-\frac{E}{kT}\right) \quad (4)$$

Here, E represents the height of the potential barrier, k represents the Boltzmann constant, and T represents the absolute temperature. According to the Levinson model, the height of the potential barrier is assumed to be attributed to a defect and can be expressed as the following Formula 5.

[FORMULA 5]

$$E = \frac{e^2 N^2}{8\varepsilon n} = \frac{e^3 N^2 t}{8\varepsilon C_{ox} V_g} \quad (5)$$

Here, e represents the elementary charge, N represents the average defect density per unit area in a channel, $\varepsilon$ represents the permittivity of the semiconductor, n represents the carrier density per unit area in the channel, $C_{ox}$ represents the capacitance per unit area, $V_g$ represents the gate voltage, and t represents the thickness of the channel. In the case where the thickness of the semiconductor film is less than or equal to 30 nm, the thickness of the channel may be regarded as being the same as the thickness of the semiconductor film.

The drain current $I_d$ in a linear region can be represented as the following Formula 6.

[FORMULA 6]

$$I_d = \frac{W \mu V_g V_d C_{ox}}{L} \exp\left(-\frac{E}{kT}\right) \quad (6)$$

Here, L represents the channel length and W represents the channel width, and L and W are each 10 μm. In addition, $V_d$ represents the drain voltage.

When dividing both sides of Formula 6 by $V_g$ and then taking logarithms of both sides, the following Formula 7 can be obtained.

[FORMULA 7]

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad (7)$$

The right side of Formula 7 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density in a semiconductor can be evaluated from the $I_d$–$V_g$ characteristics of the transistor.

The defect density in the semiconductor depends on the substrate temperature in formation of a semiconductor film. FIG. 10 shows a relation between the substrate temperature in the film formation and the defect density in the oxide semiconductor. The oxide semiconductor film is formed using a target with a ratio of In:Ga:Zn=1:1:1 (atomic ratio). It is shown that as the substrate temperature in the film formation is higher, a defect density N in the oxide semiconductor film is lower.

On the basis of the defect density in the oxide semiconductor film obtained in this manner, calculation is conducted using Formula 4 and Formula 5, so that the original field-effect mobility $\mu_0$ is calculated to be 80 cm$^2$/Vs. In other words, the ideal field-effect mobility $\mu_0$ using the oxide semiconductor without a defect inside the semiconductor and a defect at the interface between the oxide semiconductor and the gate insulating film in contact with the oxide semiconductor is 80 cm$^2$/Vs. However, in an oxide semiconductor with many defects (N approximately 1.5×10$^{12}$/cm$^2$), the field-effect mobility $\mu$ is approximately 10 cm$^2$/Vs.

Note that even when no defect exists inside a semiconductor, scattering at an interface between the channel and a gate insulating film affects the transport property of the transistor. In other words, the field-effect mobility $\mu_1$ at a position that is distance x away from the interface between the semiconductor and the gate insulating film can be expressed as Formula 8.

[FORMULA 8]

$$\frac{1}{\mu_1} = \frac{1}{\mu_0} + \frac{D}{B}\exp\left(-\frac{x}{l}\right) \quad (8)$$

Here, D represents the intensity of an electric field of the gate, and B and l are constants. B and l can be obtained from actual measurement of electrical characteristics of the transistor, and B=2.38×10$^7$ cm/s and l=10 nm (a depth in which the influence of the interface scattering occurs) are obtained by the actual measurement of electrical characteristics of the transistor using the oxide semiconductor film. When D is increased (i.e., when the gate voltage is increased), the second term of Formula 8 is increased and accordingly the field-effect mobility $\mu_1$ is decreased.

Calculation results of the field-effect mobility $\mu_2$ of an ideal transistor whose channel includes an oxide semiconductor without a defect inside the semiconductor are shown in FIG. 11. For the calculation, device simulation software Sentaurus Device manufactured by Synopsys, Inc. was used, and the bandgap, the electron affinity, the relative permittivity, and the thickness of the oxide semiconductor were assumed to be 3.15 eV, 4.6 eV, 15, and 30 nm, respectively. Further, the work function of a gate is assumed to be 5.5 eV, and the work functions of a source and a drain were each assumed to be 4.6 eV. The thickness of a gate insulating film was assumed to be 30 nm, and the relative permittivity thereof was assumed to be 4.1. The channel length and the channel width were each assumed to be 10 μm, and the drain voltage $V_d$ was assumed to be 0.1 V.

As shown in FIG. 11, the field-effect mobility $\mu_2$ has a peak of more than 50 cm$^2$/Vs at a gate voltage that is between 1 V and 2V and is decreased as the gate voltage $V_g$ becomes higher because the influence of interface scattering is increased.

Further, the case where In—Sn—Zn oxide is used will also be described below. The actually measured field-effect mobility of an insulated gate transistor can be lower than its original field-effect mobility because of a variety of reasons; this phenomenon occurs as described above. One of the reasons that reduce the field-effect mobility is a defect inside a semiconductor or a defect at an interface between the semiconductor and an insulating film. When a Levinson model is used, the field-effect mobility on the assumption that no defect exists inside the semiconductor can be calculated theoretically. In the following case, the field-effect mobility can be calculated theoretically in the above manner.

Assuming that the original field-effect mobility and the measured field-effect mobility are $\mu_0$ and $\mu$, respectively, and a potential barrier (such as a grain boundary) exists in the semiconductor, the measured field-effect mobility can be expressed as the following Formula 4.

[FORMULA 9]

$$\mu = \mu_0 \exp\left(-\frac{E}{kT}\right) \quad (4)$$

Here, E represents the height of the potential barrier, k represents the Boltzmann constant, and T represents the absolute temperature. When the potential barrier is assumed to be attributed to a defect, the height of the potential barrier can be expressed as the following Formula 5 according to the Levinson model.

[FORMULA 10]

$$E = \frac{e^2 N^2}{8\varepsilon n} = \frac{e^3 N^2 t}{8\varepsilon C_{ox} V_g} \quad (5)$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor film is less than or equal to 30 nm, the thickness of the channel may be regarded as being the same as the thickness of the semiconductor layer. The drain current $I_d$ in a linear region can be expressed as the following Formula 6.

[FORMULA 11]

$$I_d = \frac{W \mu V_g V_d C_{ox}}{L} \exp\left(-\frac{E}{kT}\right) \quad (6)$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

[FORMULA 12]

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 kT \varepsilon C_{ox} V_g} \quad (7)$$

The right side of Formula 7 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$–$V_g$ characteristics of the transistor. The defect density N of an oxide semiconductor film in which the atomic ratio of indium (In), tin (Sn), and zinc (Zn) is 1:1:1 is approximately $1\times10^{12}$/cm$^2$.

On the basis of the defect density obtained in this manner, or the like, $\mu_0$ can be calculated to be 120 cm$^2$/Vs from Formula 4 and Formula 5. The measured field-effect mobility of a transistor that includes an In—Sn—Zn oxide including a defect is approximately 35 cm$^2$/Vs. However, assuming that no defect exists inside the semiconductor and at the interface between the semiconductor and a gate insulating film, the field-effect mobility $\mu_0$ of the oxide semiconductor film is expected to be 120 cm$^2$/Vs.

Note that even when no defect exists inside a semiconductor film, scattering at an interface between the semiconductor and a gate insulating film affects the transport property of the transistor. In other words, the field-effect mobility $\mu_1$ at a position that is distance x away from the interface between the semiconductor and the gate insulating film can be expressed as the following formula.

[FORMULA 13]

$$\frac{1}{\mu_1} = \frac{1}{\mu_0} + \frac{D}{B}\exp\left(-\frac{x}{l}\right) \qquad (8)$$

Here, D represents the electric field in the gate direction, and B and l are constants. B and l can be obtained from actual measurement results; according to the above measurement results, B is $4.75\times10^7$ cm/s and l is 10 nm (the depth to which the influence of interface scattering reaches). When D is increased (i.e., when the gate voltage is increased), the second term of Formula 8 is increased and accordingly the field-effect mobility $\mu_1$ is decreased.

Figure 12:
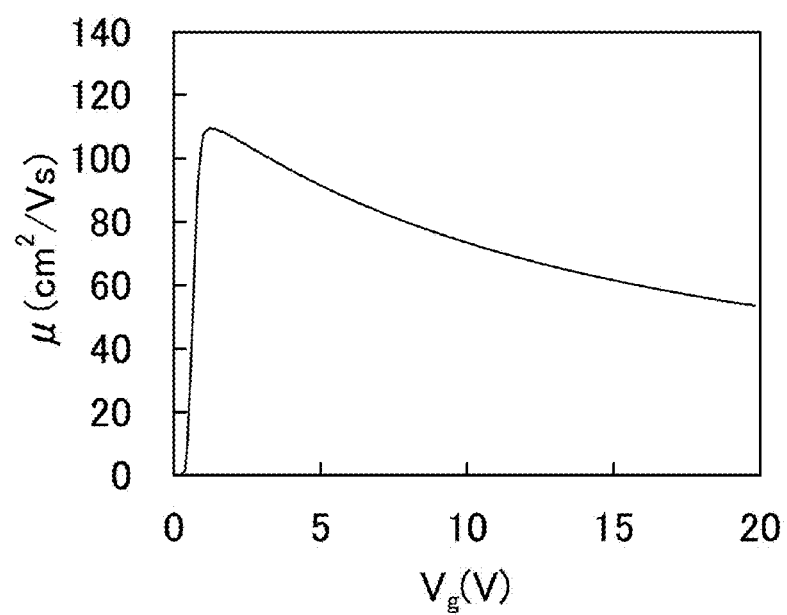
FIG. 12 shows dependence of field-effect mobility on gate voltage obtained by calculation.

Calculation results of the field-effect mobility $\mu_2$ of a transistor whose channel includes an ideal oxide semiconductor without a defect inside the semiconductor are shown in FIG. 12. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 12, the field-effect mobility has a peak of more than 100 cm$^2$/Vs at a gate voltage that is approximately 1.2 V and is decreased as the gate voltage becomes higher because the influence of interface scattering is increased. Note that in order to reduce the influence of interface scattering, it is preferable that a surface of the semiconductor film be flat at the atomic level (atomic layer flatness).

Calculation results of characteristics of minute transistors which are manufactured using such an oxide semiconductor with the field-effect mobility are shown in FIGS. 13A to 13C, FIGS. 14A to 14C, and FIGS. 15A to 15C. FIGS. 16A and 16B illustrate cross-sectional structures of the transistors used for the calculation. The transistors illustrated in FIGS. 16A and 16B each include a semiconductor region 1030a and a semiconductor region 1030c which have n$^+$-type conductivity in an oxide semiconductor film. The resistivity of the semiconductor region 1030a and the semiconductor region 1030c are $2\times10^{-3}$ Ωcm.

The transistor illustrated in FIG. 16A is formed over a base insulating film 1010 and an embedded insulator 1020 which is embedded in the base insulating film 1010 and formed of aluminum oxide. The transistor includes the semiconductor region 1030a, the semiconductor region 1030c, an intrinsic semiconductor region 1030b serving as a channel formation region therebetween, and a gate 1050. The width of the gate 1050 is 33 nm.

A gate insulating film 1040 is formed between the gate 1050 and the semiconductor region 1030b. In addition, a sidewall insulator 1060a and a sidewall insulator 1060b are formed on both side surfaces of the gate 1050, and an insulator 1070 is formed over the gate 1050 so as to prevent a short circuit between the gate 1050 and another wiring. The sidewall insulator has a width of 5 nm. A source 1080a and a drain 1080b are provided in contact with the semiconductor region 1030a and the semiconductor region 1030c, respectively. Note that the channel width of this transistor is 40 nm.

The transistor of FIG. 16B is the same as the transistor of FIG. 16A in that it is formed over the base insulating film 1010 and the embedded insulator 1020 formed of aluminum oxide and that it includes the semiconductor region 1030a, the semiconductor region 1030c, the semiconductor region 1030b provided therebetween, the gate 1050 having a width of 33 nm, the gate insulating film 1040, the sidewall insulator 1060a, the sidewall insulator 1060b, the insulator 1070, the source 1080a, and the drain 1080b.

The transistor illustrated in FIG. 16A is different from the transistor illustrated in FIG. 16B in the conductivity type of semiconductor regions under the sidewall insulator 1060a and the sidewall insulator 1060b. In the transistor illustrated in FIG. 16A, the semiconductor regions under the sidewall insulator 1060a and the sidewall insulator 1060b are part of the semiconductor region 1030a having n$^+$-type conductivity and part of the semiconductor region 1030c having n$^+$-type conductivity, whereas in the transistor illustrated in FIG. 16B, the semiconductor regions under the sidewall insulator 1060a and the sidewall insulator 1060b are part of the intrinsic semiconductor region 1030b. In other words, in the semiconductor layer illustrated in FIG. 16B, a region having a width of $L_{off}$ which overlaps with neither the semiconductor region 1030b nor the gate 1050 is provided. This region is called an offset region, and the width $L_{off}$ is called an offset length. As is seen from the drawing, the offset length is equal to the width of the sidewall insulator 1060a (the sidewall insulator 1060b).

Figure 13A:
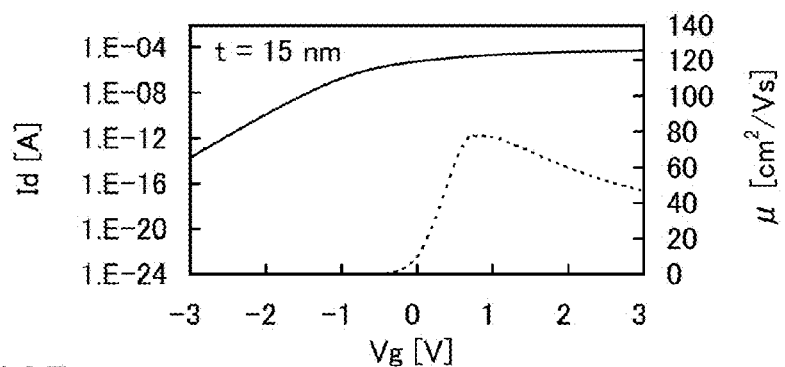
FIGS. 13A to 13C each shows the gate voltage dependence of drain current and field-effect mobility obtained by calculation.
Figure 13B:
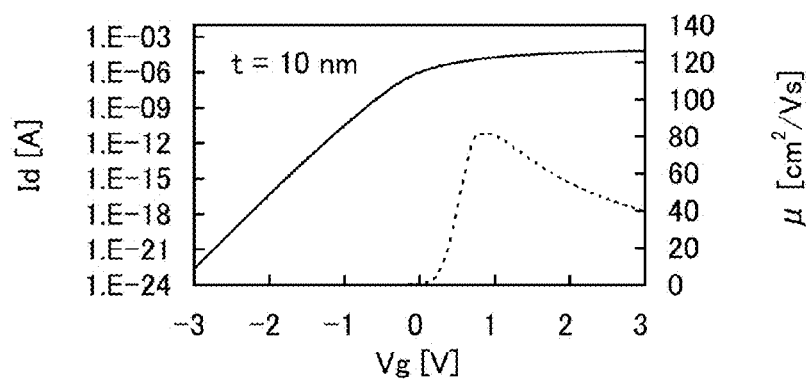
Figure 13C:
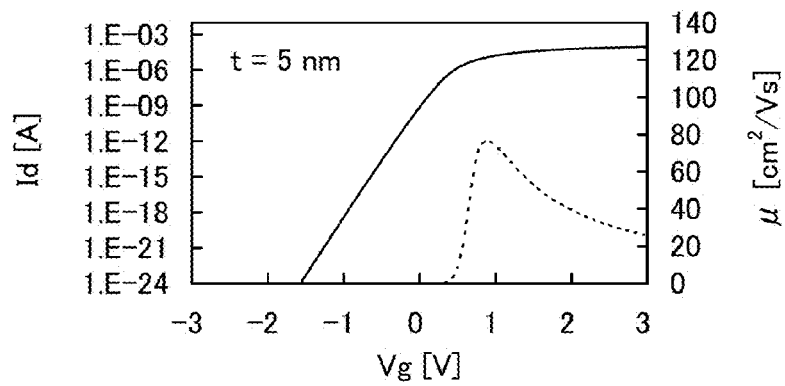

The other parameters used in calculation are as described above. For the calculation, device simulation software Sentaurus Device manufactured by Synopsys, Inc. was used. FIGS. 13A to 13C show the gate voltage ($V_g$: a potential difference between the gate and the source) dependence of the drain current ($I_d$, a solid line) and the field-effect mobility (μ, a dotted line) of the transistor having the structure illustrated in FIG. 16A. The drain current $I_d$ is obtained by calculation under the assumption that the drain voltage (a potential difference between the drain and the source) is +1 V and the field-effect mobility μ is obtained by calculation under the assumption that the drain voltage is +0.1 V.

FIG. 13A shows the gate voltage dependence of the transistor in the case where the thickness of the gate insulating film is 15 nm, FIG. 13B shows that of the transistor in the case where the thickness of the gate insulating film is 10 nm, and FIG. 13C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the field-effect mobility μ and the drain current $I_d$ in an on state (on-state current). The graphs show that the drain current exceeds 10 μA, which is required in a memory element and the like, at a gate voltage of around 1 V.

Figure 14A:
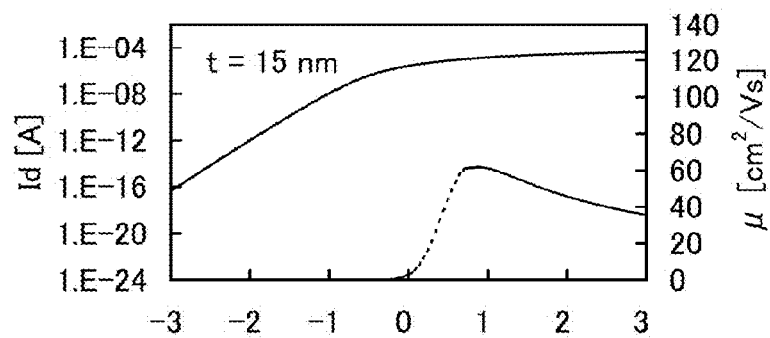
FIGS. 14A to 14C each shows the gate voltage dependence of drain current and field-effect mobility obtained by calculation.
Figure 14B:
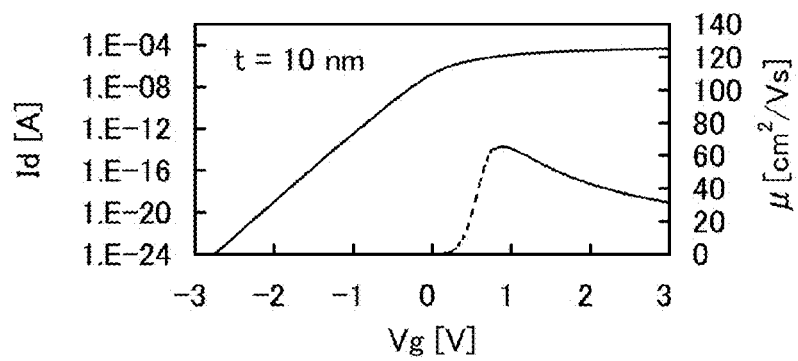
Figure 14C:
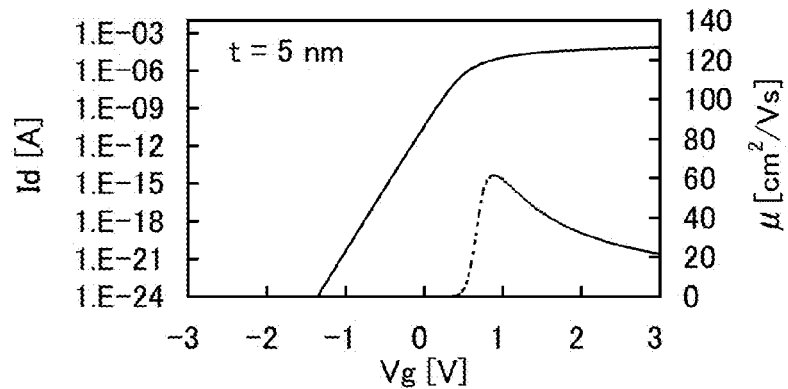

FIGS. 14A to 14C show the gate voltage $V_g$ dependence of the drain current $I_d$ (a solid line) and the field-effect mobility μ (a dotted line) of the transistor having the structure illustrated in FIG. 16B where the offset length $L_{off}$ is 5 nm. The drain current $I_d$ is obtained by calculation under the assumption that the drain voltage is +1 V and the field-effect mobility μ is obtained by calculation under the assumption that the drain voltage is +0.1 V. FIG. 14A shows the gate voltage dependence of the transistor in the case where the thickness of the gate insulating film is 15 nm, FIG. 14B shows that of the transistor in the case where the thickness of the gate insulating film is 10 nm, and FIG. 14C shows that of the transistor in the case where the thickness of the gate insulating film is 5 nm.

Figure 15A:
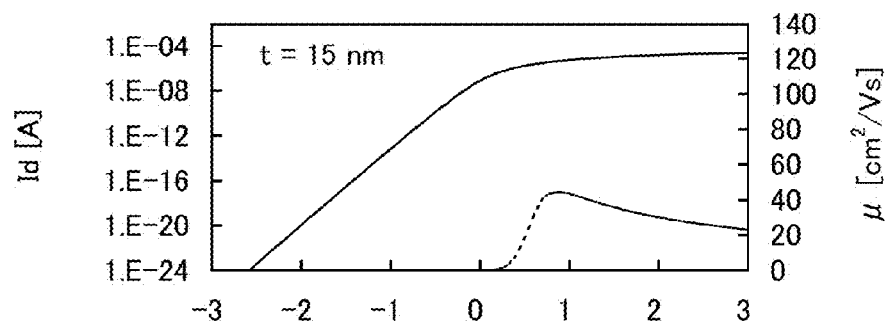
FIGS. 15A to 15C each shows the gate voltage dependence of drain current and field-effect mobility obtained by calculation.
Figure 15B:
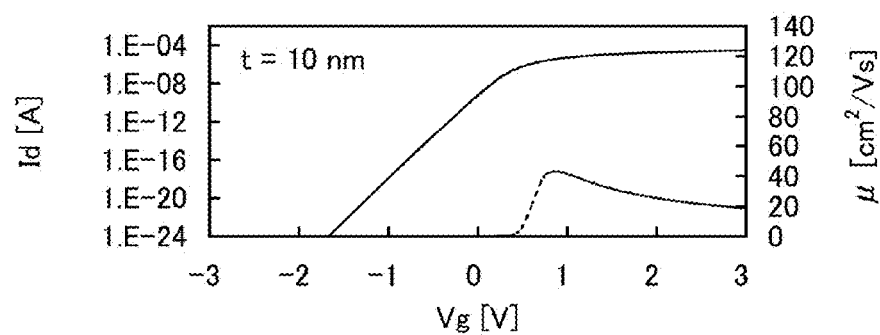
Figure 15C:
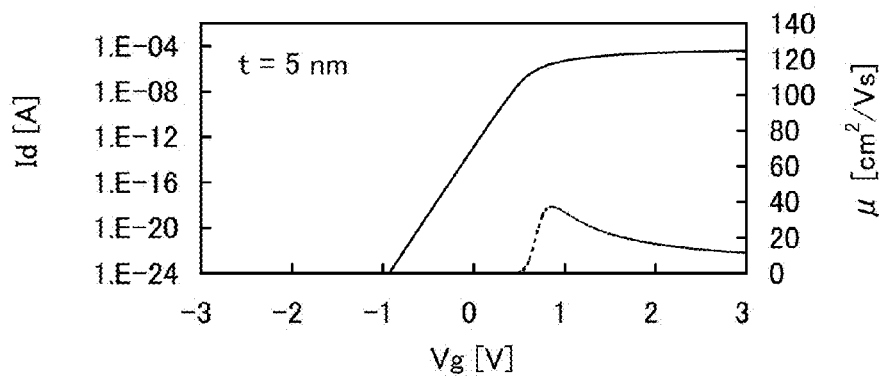
Figure 16A:
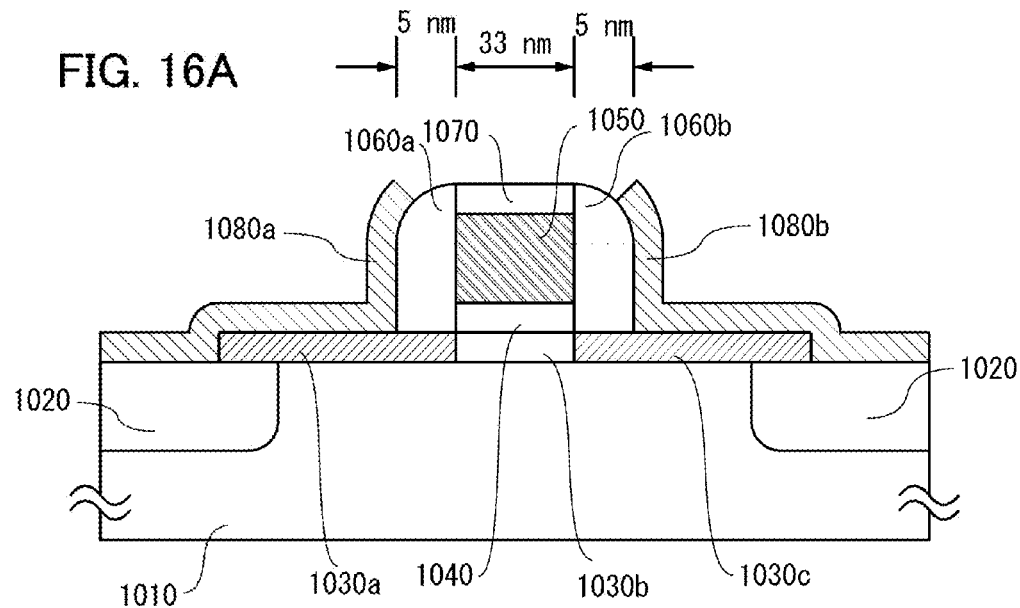
FIGS. 16A and 16B illustrate cross-sectional structures of transistors used for calculation.
Figure 16B:
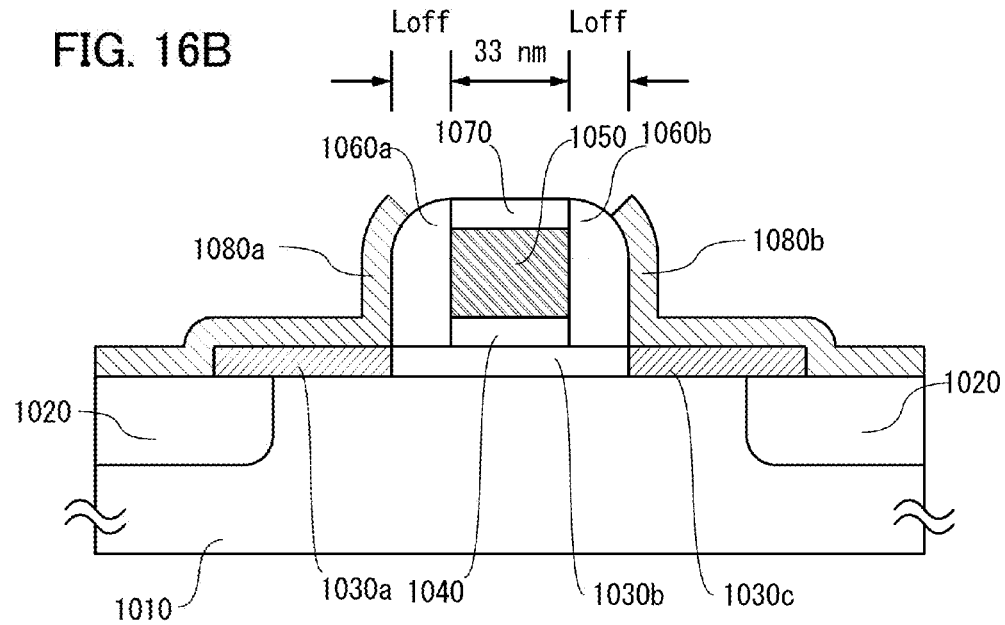

Further, FIGS. 15A to 15C show the gate voltage dependence of the drain current $I_d$ (a solid line) and the field-effect mobility μ (a dotted line) of the transistor having the structure illustrated in FIG. 16B where the offset length $L_{off}$ is 15 nm. The drain current $I_d$ is obtained by calculation under the assumption that the drain voltage is +1 V and the field-effect mobility μ is obtained by calculation under the assumption that the drain voltage is +0.1 V. FIG. 15A shows the gate voltage dependence of the transistor in the case where the thickness of the gate insulating film is 15 nm, FIG. 15B shows that of the transistor in the case where the thickness of the gate insulating film is 10 nm, and FIG. 15C shows that of the transistor in the case where the thickness of the gate insulating film is 5 nm.

In either of the structures, as the gate insulating film is thinner, the off-state current is significantly decreased, whereas no noticeable change arises in the peak value of the field-effect mobility μ and the on-state current.

Note that the peak of the field-effect mobility μ is approximately 80 cm$^2$/Vs in FIGS. 13A to 13C, approximately 60 cm$^2$/Vs in FIGS. 14A to 14C, and approximately 40 cm$^2$/Vs in FIGS. 15A to 15C; thus, the peak of the mobility μ is decreased as the offset length $L_{off}$ is increased. Further, the same applies to the off-state current. The on-state current is decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

As described in this embodiment, a semiconductor memory device in which the frequency of refresh operations is decreased and which includes a circuit for detecting timing of the refresh operation can be provided.

The semiconductor memory device described in this embodiment can store data for a long time without a supply of a power supply potential and the timing of refresh operation is appropriate, so that the power consumption can be low.

Further, as the refresh timing detection circuit, it is not necessary to provide a counter for counting a long time, whereby a more highly integrated semiconductor memory device with a smaller area can be provided. Furthermore, the power consumption due to the refresh timing detection circuit can be reduced.

This embodiment can be implemented in appropriate combination with the other embodiments.

Embodiment 2

Figure 2:
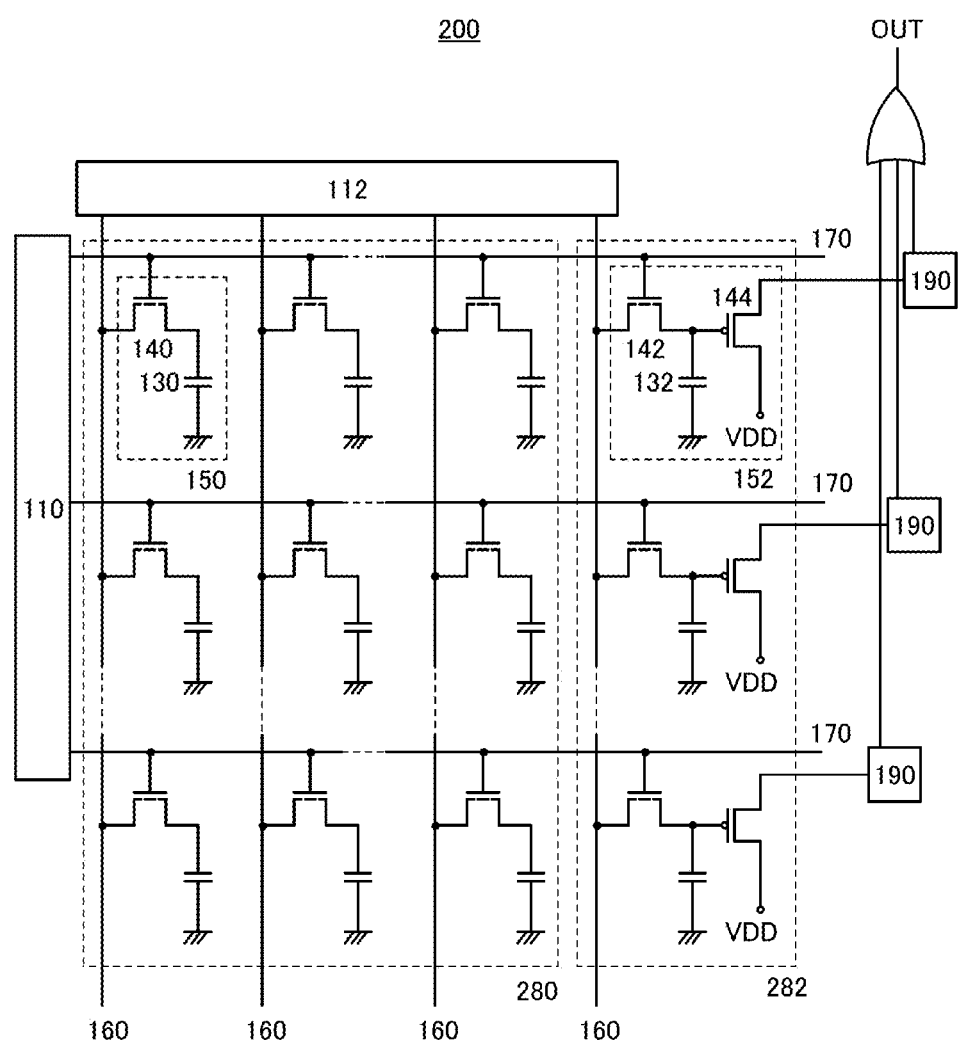
FIG. 2 illustrates an example of a semiconductor memory device which is one embodiment of the present invention.

In this embodiment, a memory module 200 which has a different structure from that of the memory module 100 described in Embodiment 1 will be described with reference to FIG. 2.

The memory module 200 is different from the memory module 100 in that it includes a reference cell group 282 including a plurality of reference cells 152.

Further, since the plurality of reference cells 152 is included, a memory cell array 280 has a storage capacity little smaller than that of the memory cell array 180.

Each of the plurality of reference cells 152 included in the reference cell group 282 may be connected to the bit line 160 in the same column, but the present invention is not limited thereto. For example, the different reference cells 152 may be connected to the bit lines 160 in different columns. Further, the reference cells 152 are not necessarily close to each other.

In the reference cell group 282, when the drain current flows from each of the reference cells 152 to the comparative circuit 190 connected to each of the reference cells 152 and VR is higher than Vref in any of the comparative circuits 190, the refresh operation of the memory cell array 280 and the reference cell group 282 is performed.

The structure including the plurality of the reference cells 152 prevents the refresh operation from not being performed at an appropriate time due to variations in performance of a transistor or a capacitor, and the refresh operation can be performed at the appropriate time surely.

This embodiment can be implemented in appropriate combination with the other embodiments.

Embodiment 3

Figure 3:
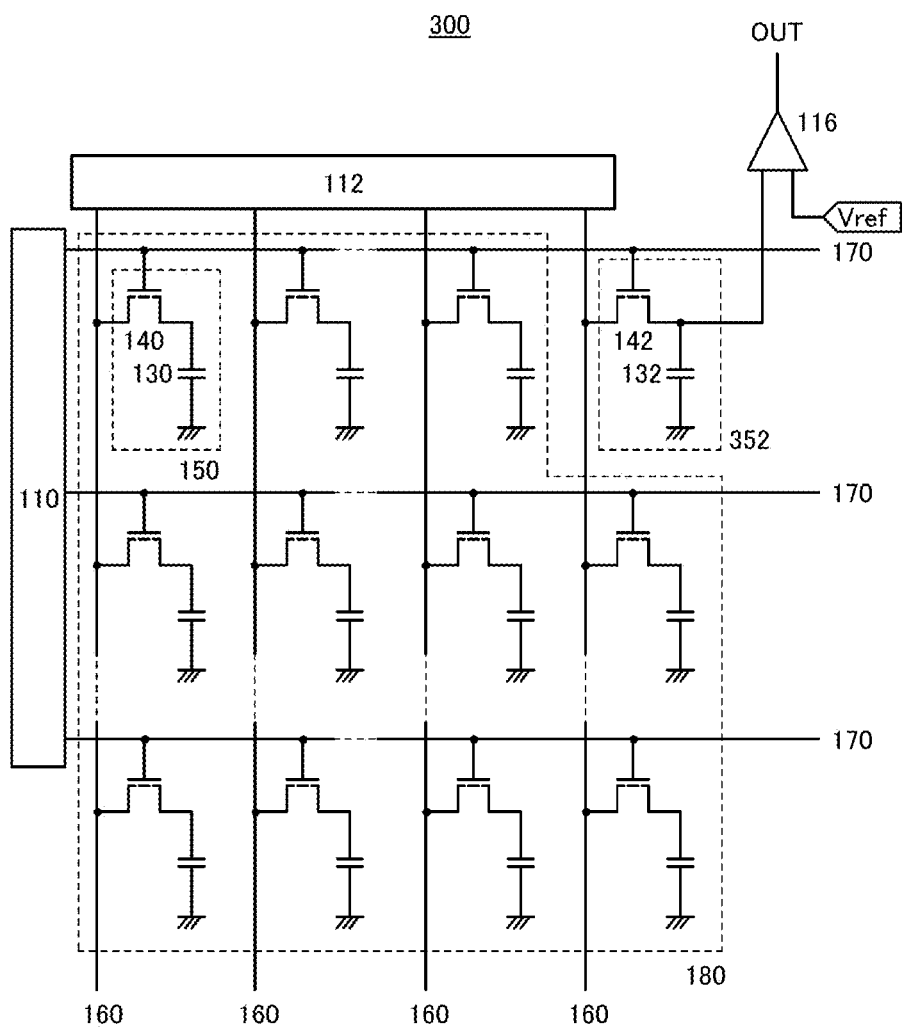
FIG. 3 illustrates an example of a semiconductor memory device which is one embodiment of the present invention.

In this embodiment, a memory module 300 having a structure different from those of the memory module 100 and the memory module 200 described in Embodiment 1 and Embodiment 2 will be described with reference to FIG. 3.

The memory module 300 is different from the memory module 100 and the memory module 200 in that the third transistor 144 is not included in a reference cell 352 corresponding to the reference cell 152.

Therefore, in the comparator 116, Vref and the potential of the second capacitor 132 are compared. That is, when the potential of the second capacitor 132 is gradually decreased and becomes lower than Vref, the refresh operation may be performed to the memory cell array 180 and the reference cell 352.

This embodiment has a structure in which the third transistor 144 is not provided, whereby the structure is simplified for easy manufacture.

On the other hand, in order to detect the timing of the refresh operation accurately, the capacitance of the second capacitor 132 needs to be larger than or equal to a certain amount. By comparing the size of the second capacitor 132 and simplification of the structure by providing no third transistor 144, an appropriate form may be selected according to a semiconductor memory device to be manufactured.

This embodiment can be implemented in appropriate combination with the other embodiments.

Embodiment 4

A central processing unit (CPU) can be formed with use of any of the semiconductor memory devices described in Embodiments 1 to 3 for at least part of the CPU.

Figure 5A:
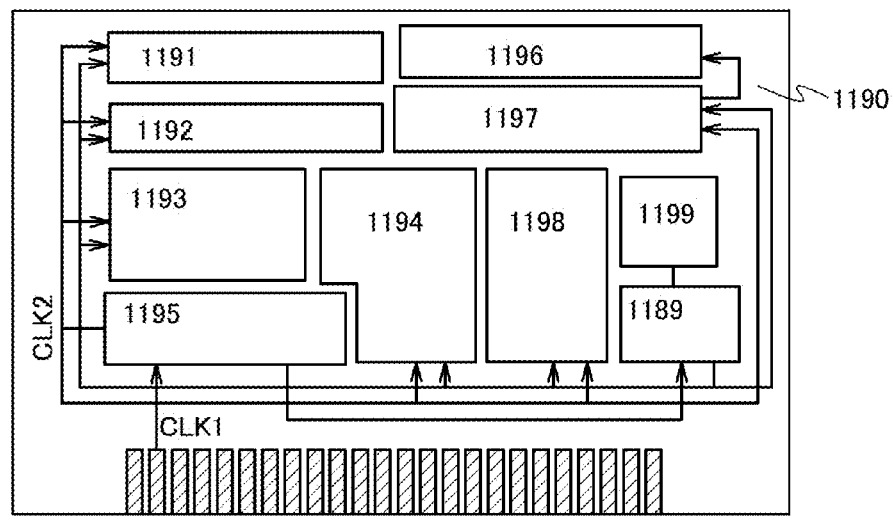
FIG. 5A is a block diagram illustrating a specific example of a CPU including a transistor which is one embodiment of the present invention and FIGS. 5B and 5C are circuit diagrams each illustrating part of the CPU.

FIG. 5A is a block diagram illustrating a specific structure of a CPU. The CPU illustrated in FIG. 5A includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Obviously, the CPU illustrated in FIG. 5A is only an example in which the structure is simplified, and an actual CPU may have various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the clock signal CLK2 to the above circuits.

In the CPU illustrated in FIG. 5A, a semiconductor memory device is provided in the register 1196. Any of the semiconductor memory devices described in Embodiment 1 to 3 can be used as the semiconductor memory device provided in the register 1196.

In the CPU illustrated in FIG. 5A, the register controller 1197 selects operation of holding data in the register 1196 in accordance with an instruction from the ALU 1191. That is, the register controller 1197 selects whether data is held by a phase-inversion element or a capacitor in the semiconductor memory device included in the register 1196. When data holding by the phase-inversion element is selected, power supply voltage is supplied to the semiconductor memory device in the register 1196. When data holding by the capacitor is selected, the data is rewritten in the capacitor, and supply of power supply voltage to the semiconductor memory device in the register 1196 can be stopped.

Figure 5B:
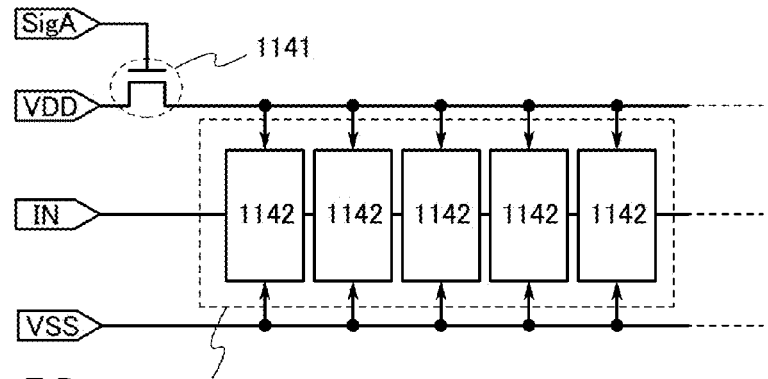
Figure 5C:
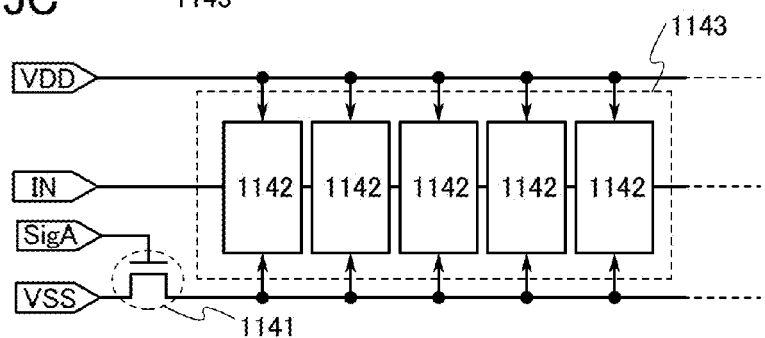

The power supply can be stopped by providing a switching element between a semiconductor memory device group and a node to which a high-level power supply potential VDD or a low-level power supply potential VSS is supplied, as illustrated in FIG. 5B or FIG. 5C. Circuits illustrated in FIGS. 5B and 5C will be described below.

FIGS. 5B and 5C each illustrate an example of a structure of a memory circuit including, as a switching element for controlling supply of a power supply potential to a semiconductor memory device, a transistor in which an oxide semiconductor is used for an active layer.

The memory device illustrated in FIG. 5B includes a switching element 1141 and a semiconductor memory device group 1143 including a plurality of semiconductor memory devices 1142. Specifically, as each of the semiconductor memory devices 1142, the semiconductor memory device described in Embodiment 3 can be used. Each of the semiconductor memory devices 1142 included in the semiconductor memory device group 1143 is supplied with the high-level power supply potential VDD via the switching element 1141. Further, each of the semiconductor memory devices 1142 included in the semiconductor memory device group 1143 is supplied with a potential of a signal IN and the low-level power supply potential VSS.

In FIG. 5B, as the switching element 1141, a transistor in which a semiconductor with a wide band gap such as an oxide semiconductor is used for an active layer is used, and the switching of the transistor is controlled by a signal SigA supplied to a gate electrode thereof. As the switching element 1141, the first transistor 140 described in Embodiment 1 may be used.

Note that FIG. 5B illustrates the structure in which the switching element 1141 includes only one transistor; however, without limitation thereto, the switching element 1141 may include a plurality of transistors. In the case where the switching element 1141 includes a plurality of transistors each serving as a switching element, the plurality of transistors may be connected to each other in parallel, in series, or in combination of parallel connection and series connection.

FIG. 5C illustrates an example of a memory device in which each of the semiconductor memory devices 1142 included in the semiconductor memory device group 1143 is supplied with the low-level power supply potential VSS via the switching element 1141. The supply of the low-level power supply potential VSS to each of the semiconductor memory devices 1142 included in the semiconductor memory device group 1143 can be controlled by the switching element 1141.

When a switching element is provided between a semiconductor memory device group and a node to which the power supply potential VDD or the power supply potential VSS is supplied, data can be held even in the case where operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented in appropriate combination with any of the above embodiments.

Embodiment 5

A transistor in which a channel formation region is included in an oxide semiconductor film including In, Sn, and Zn can have favorable characteristics by depositing the oxide semiconductor film while heating a substrate or by performing heat treatment after an oxide semiconductor film is formed. Note that a main component refers to an element included in a composition at greater than or equal to 5 atomic %.

By intentionally heating the substrate after formation of the oxide semiconductor film including In, Sn, and Zn, the field-effect mobility of the transistor can be improved. Further, the threshold voltage of the transistor can be positively shifted to make the transistor normally off.

Figure 17A:
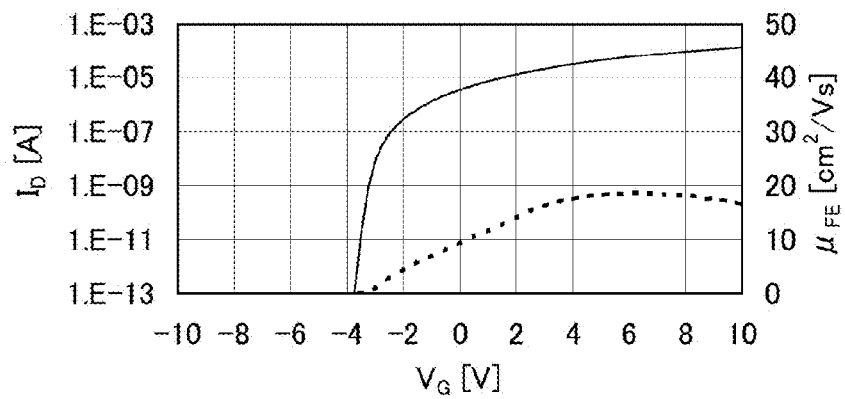
FIGS. 17A to 17C each shows characteristics of a transistor including an oxide semiconductor film.
Figure 17B:
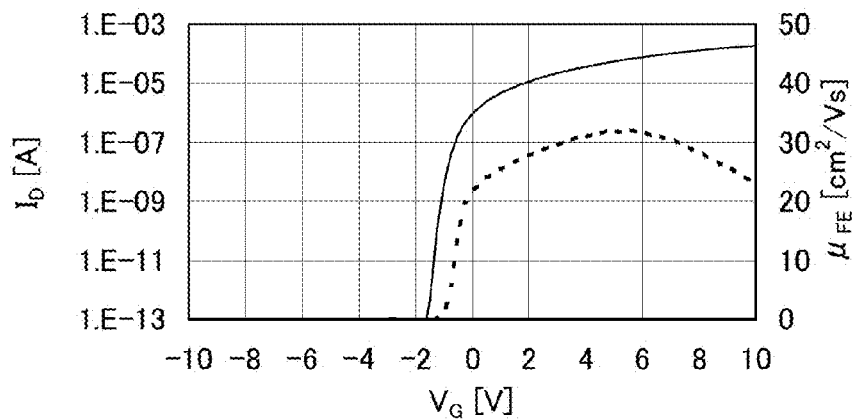
Figure 17C:
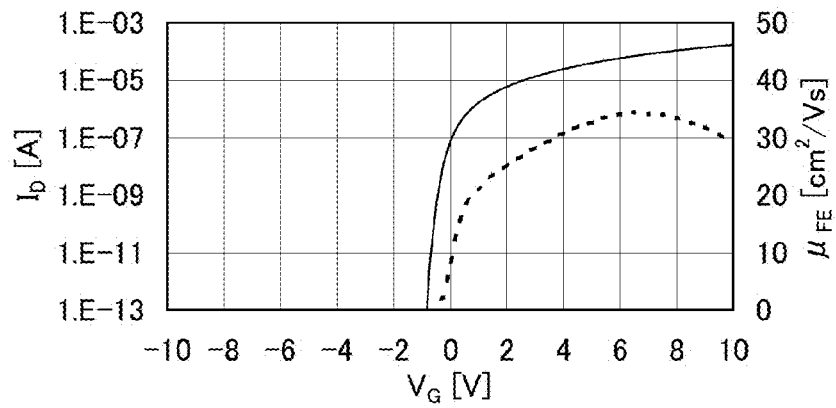

For example, FIGS. 17A to 17C show characteristics of a transistor including an oxide semiconductor film including In, Sn, and Zn and a gate insulating layer with the thickness of 100 nm. Note that $V_d$ was set to 10 V. A channel length L was set to 3 µm and a channel width W was set to 10 µm.

FIG. 17A shows characteristics of a transistor whose oxide semiconductor film including In, Sn, and Zn was formed by a sputtering method without heating a substrate intentionally. The field-effect mobility µFE of the transistor is 18.8 cm$^2$/Vs. On the other hand, when the oxide semiconductor film including In, Sn, and Zn is formed while heating the substrate intentionally, the field-effect mobility can be improved. FIG. 17B shows characteristics of a transistor whose oxide semiconductor film including In, Sn, and Zn was formed while heating a substrate at 200° C. The field-effect mobility µFE of the transistor is 32.2 cm$^2$/Vs.

The field-effect mobility can be further improved by performing heat treatment after formation of the oxide semiconductor film including In, Sn, and Zn. FIG. 17C shows characteristics of a transistor whose oxide semiconductor film including In, Sn, and Zn was formed by sputtering at 200° C. and then subjected to heat treatment at 650° C. The field-effect mobility µFE of the transistor is 34.5 cm$^2$/Vs.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case of using such a purified non-single-crystal oxide semiconductor, ideally, a field-effect mobility exceeding 100 cm$^2$/Vs is expected to be realized.

The oxide semiconductor including In, Sn, and Zn may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 17A and 17B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied under a condition of 2 MV/cm at 150° C. for one hour, drift of the threshold voltage can be less than ±1.5 V, preferably less than ±1.0 V.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1\times10^{16}$ atoms/cm$^3$ and lower than or equal to $2\times10^{20}$ atoms/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 [atomic ratio] without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn-based oxide film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn-based oxide film with a thickness of 100 nm was formed over a quartz substrate that had been subjected to dehydrogenation treatment.

The In—Sn—Zn-based oxide film was formed with a sputtering apparatus with a power of 100 W (DC) in an oxygen atmosphere. An In—Sn—Zn-based oxide target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 18:
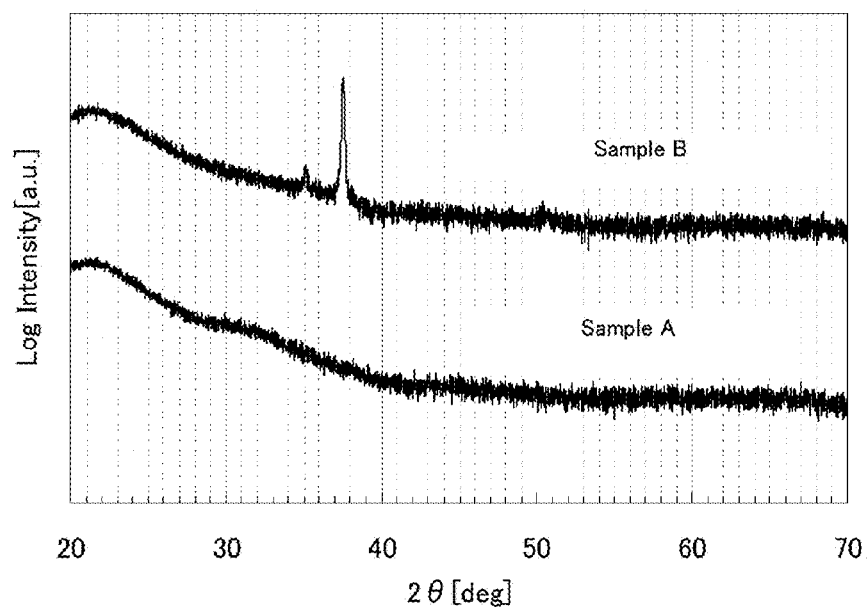
FIG. 18 illustrates XRD spectra of Sample A and Sample B.

FIG. 18 shows XRD spectra of Sample A and Sample B. No peak derived from crystal was observed in Sample A, whereas peaks derived from crystal were observed when 2θ was around 35 deg. and 37 deg. to 38 deg. in Sample B.

As described above, by intentionally heating a substrate during deposition of an oxide semiconductor film including In, Sn, and Zn and/or by performing heat treatment after the deposition, characteristics of a transistor can be improved.

These substrate heating and heat treatment have an effect of preventing hydrogen and a hydroxyl group, which are unfavorable impurities for an oxide semiconductor film, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The purification of an oxide semiconductor enables the off-state current of the transistor to be 1 aA/μm or lower. Here, the unit of the off-state current is used to indicate current per micrometer of a channel width.

Figure 19:
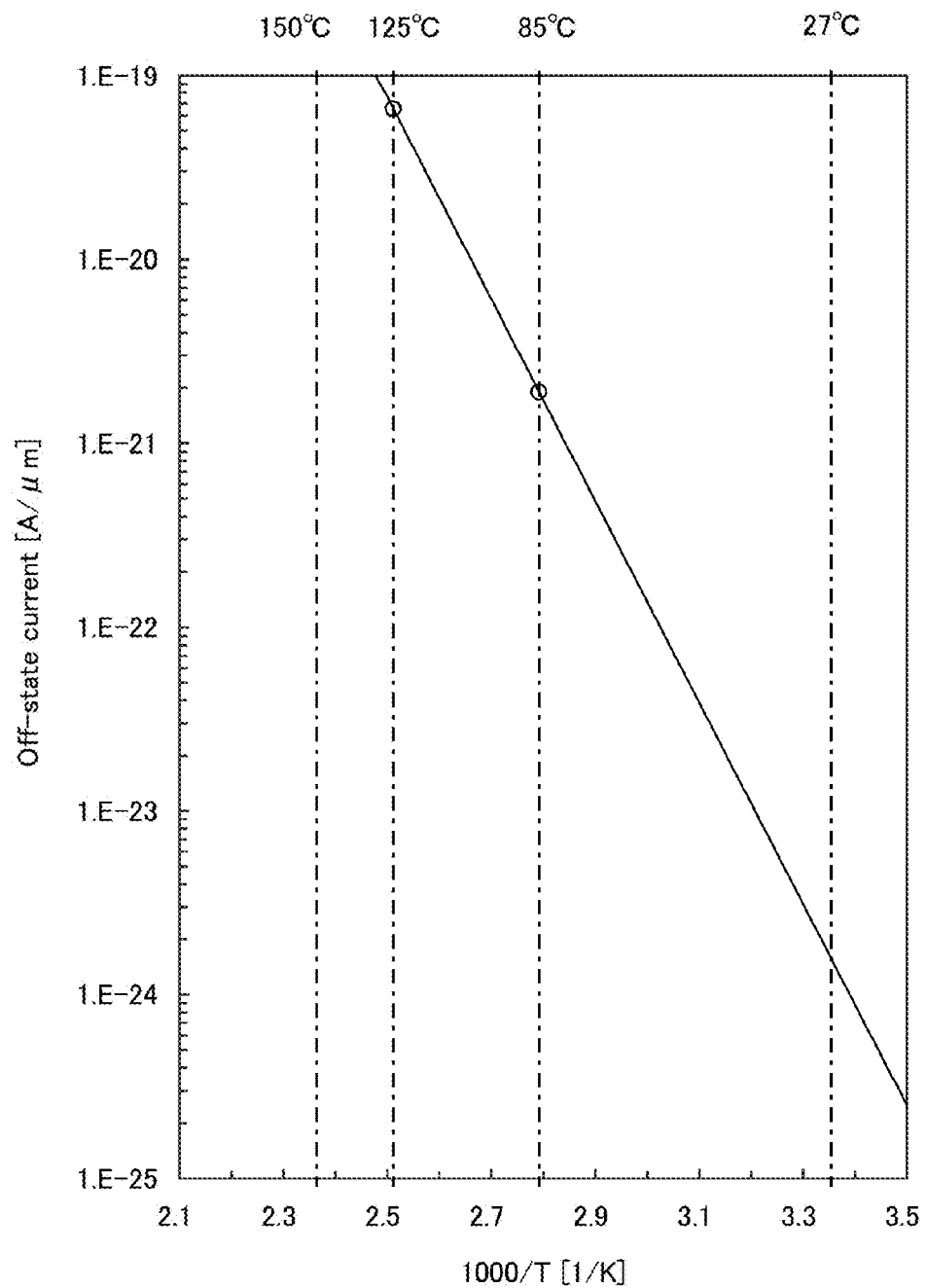
FIG. 19 illustrates a relation between substrate temperature in measurement and off-state current of a transistor.

FIG. 19 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 19, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively. The above values of off-state currents are clearly much lower than that of the transistor using Si as a semiconductor film.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn by heat treatment, a film which does not include moisture originally is preferably formed because moisture is released from the oxide semiconductor including In, Sn, and Zn at a higher temperature than from an oxide semiconductor including In, Ga, and Zn as main components.

The relation between the substrate temperature and electrical characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 20:
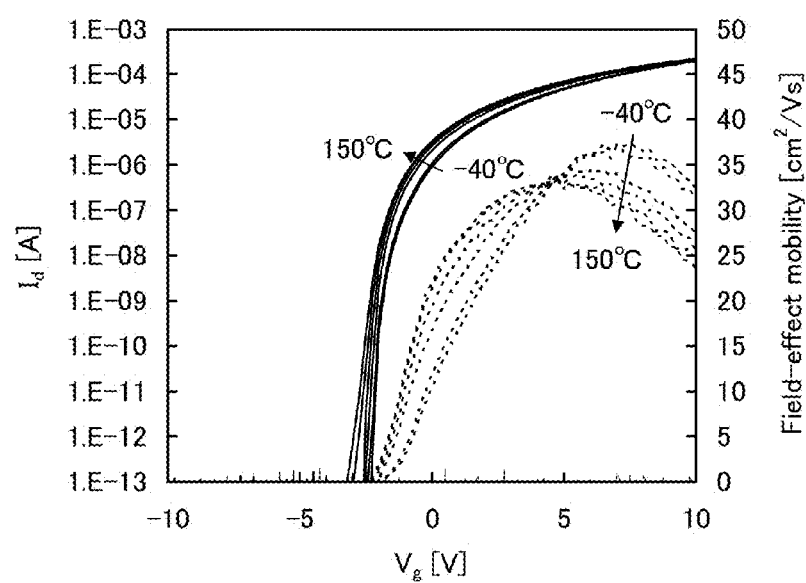
FIG. 20 illustrates dependence of $I_d$ and field-effect mobility on $V_g$.
Figure 21A:
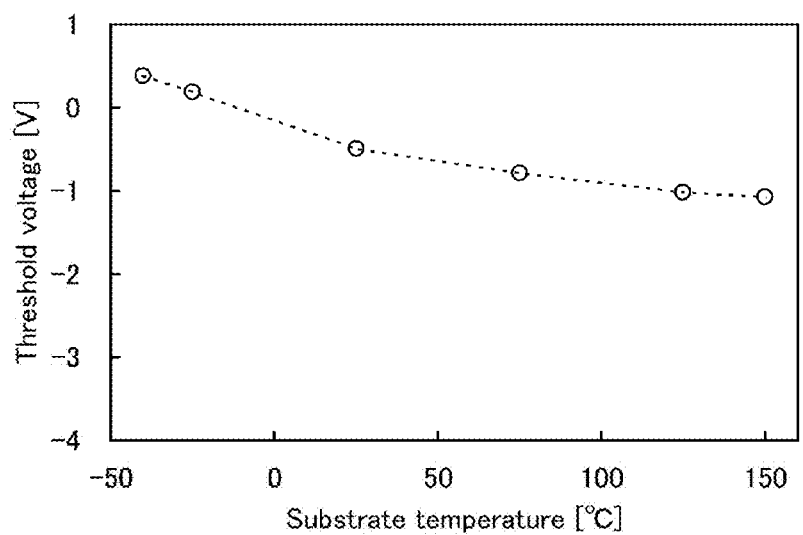
FIG. 21A illustrates relation between substrate temperature and the threshold voltage.

FIG. 20 shows the $V_g$ dependence of $I_d$ (a solid line) and field-effect mobility (a dotted line). FIG. 21A shows a relation between the substrate temperature and the threshold voltage, and FIG. 21B shows a relation between the substrate temperature and the field-effect mobility.

From FIG. 21A, it is found that the threshold voltage gets lower as the substrate temperature increases. Note that the threshold voltage is decreased from 0.38 V to −1.08 V in the range from −40° C. to 150° C.

Figure 21B:
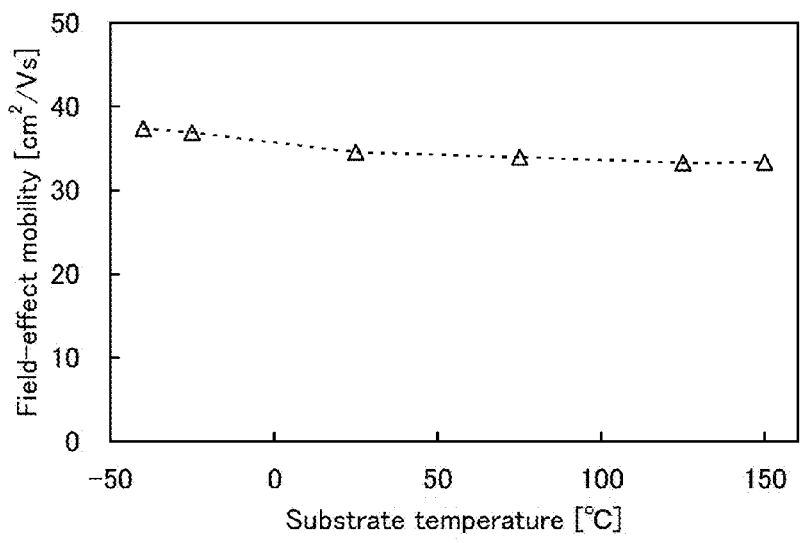
FIG. 21B illustrates relation between substrate temperature and field-effect mobility.

From FIG. 21B, it is found that the field-effect mobility gets lower as the substrate temperature increases. Note that the field-effect mobility is decreased from 37.4 $cm^2$/Vs to 33.4 $cm^2$/VS in the range from −40° C. to 150° C. Thus, it is found that variation in electrical characteristics is small in the above temperature range.

In a transistor in which such an oxide semiconductor including In, Sn, and Zn is used as a channel formation region, a field-effect mobility of 30 $cm^2$/Vs or higher, preferably 40 $cm^2$/Vs or higher, further preferably 60 $cm^2$/Vs or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electrical characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

Embodiment 6

In this embodiment, examples of an electronic device to which any of Embodiments 1 to 4 is applied will be described.

Figure 6A:
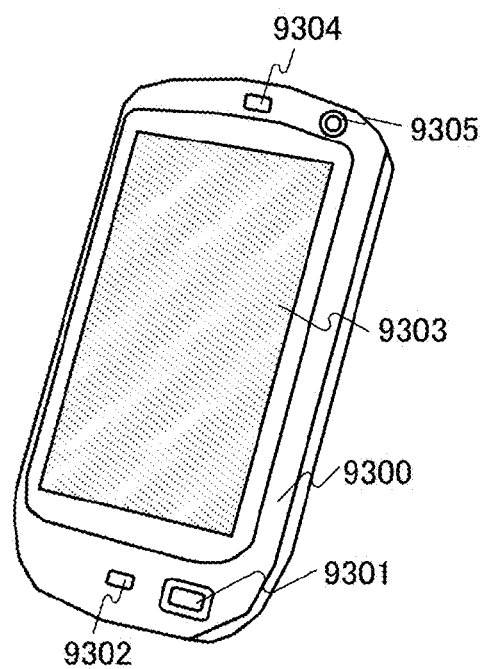
FIGS. 6A and 6B are perspective views each illustrating an example of an electronic device which is one embodiment of the present invention.

FIG. 6A illustrates a portable information terminal. The portable information terminal includes a housing 9300, a button 9301, a microphone 9302, a display portion 9303, a speaker 9304, and a camera 9305, and has a function as a mobile phone. One embodiment of the present invention can be applied to a CPU and a memory module inside the electronic device.

Figure 6B:
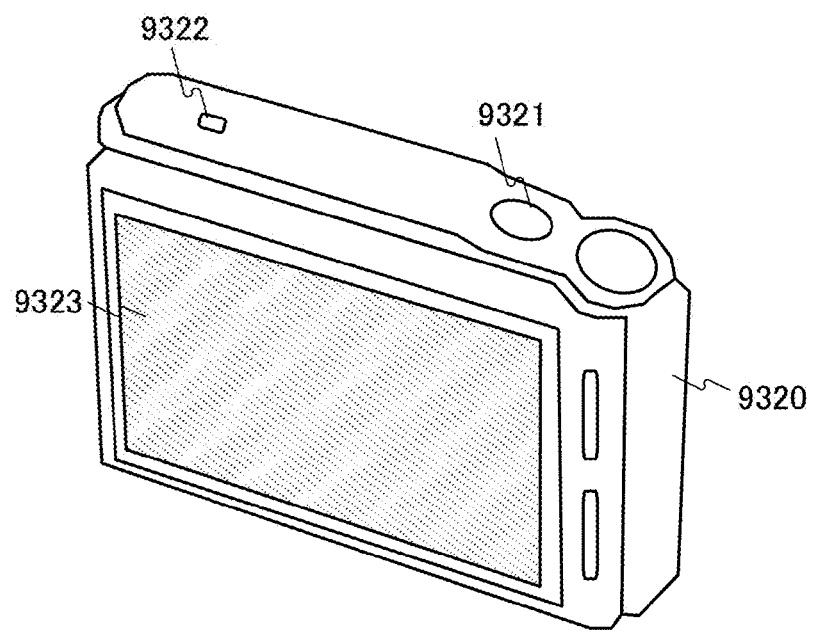

FIG. 6B illustrates a digital still camera. The digital still camera includes a housing 9320, a button 9321, a microphone 9322, and a display portion 9323. One embodiment of the present invention can be applied to a memory module inside the electronic device.

By applying an embodiment of the present invention, the quality of an electronic device can be improved. In addition, consumed power can be reduced, and reliability can be improved.

This embodiment can be implemented in appropriate combination with the other embodiments.

Example 1

In this example, an example of a transistor in which an In—Sn—Zn-based oxide film is used as an oxide semiconductor film will be described with reference to FIGS. 22A and 22B and the like.

Figure 22A:
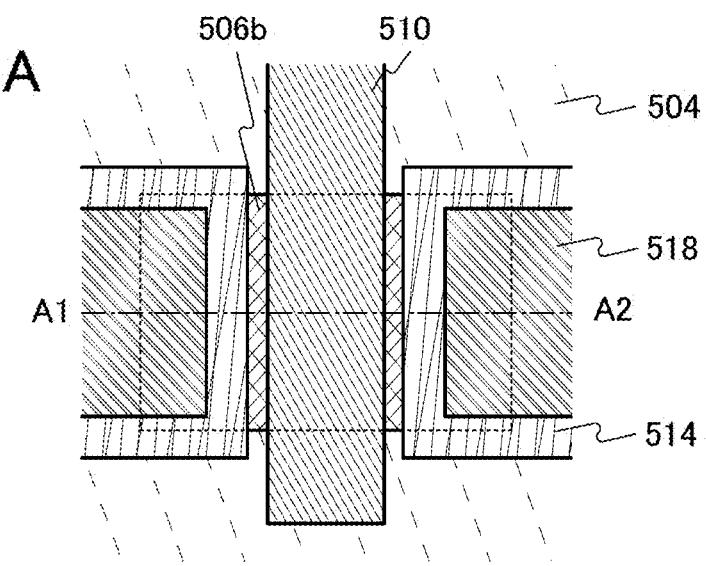
FIG. 22A is a top view of a semiconductor device.
Figure 22B:
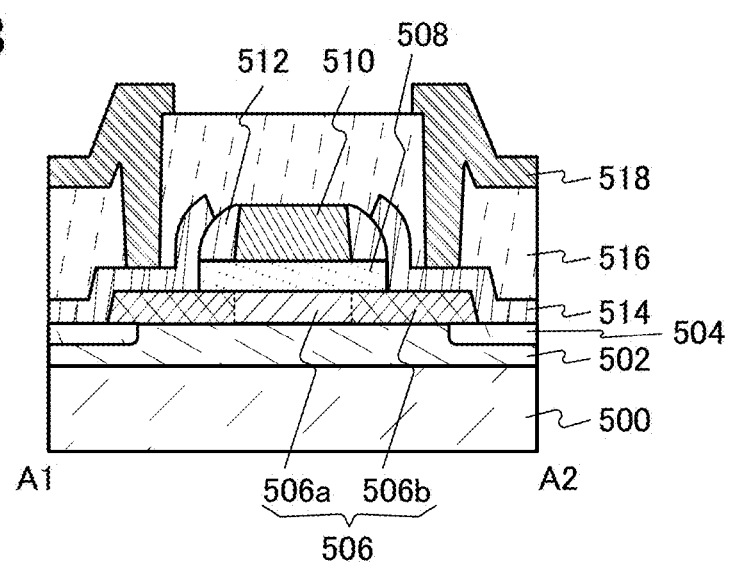
FIG. 22B is a cross-sectional view thereof.

FIGS. 22A and 22B are a top view and a cross-sectional view of a coplanar transistor having a top-gate top-contact structure. FIG. 22A is the top view of the transistor. FIG. 22B illustrates a cross-sectional view along dashed-dotted line A1-A2 in FIG. 22A.

The transistor illustrated in FIG. 22B includes a substrate 500; a base insulating film 502 provided over the substrate 500; a protective insulating film 504 provided in the periphery of the base insulating film 502; an oxide semiconductor film 506 provided over the base insulating film 502 and the protective insulating film 504 and including a high-resistance region 506a and low-resistance regions 506b; a gate insulating film 508 provided over the oxide semiconductor film 506; a gate electrode 510 provided to overlap with the oxide semiconductor film 506 with the gate insulating film 508 positioned therebetween; a sidewall insulating film 512 provided in contact with a side surface of the gate electrode 510; a pair of electrodes 514 provided in contact with at least the low-resistance regions 506b; an interlayer insulating film 516 provided to cover at least the oxide semiconductor film 506, the gate electrode 510, and the pair of electrodes 514; and a wiring 518 provided to be connected to at least one of the pair of electrodes 514 through an opening formed in the interlayer insulating film 516.

Although not illustrated, a protective film may be provided to cover the interlayer insulating film 516 and the wiring 518. With the protective film, a minute amount of leakage current generated by surface conduction of the interlayer insulating film 516 can be reduced and thus the off-state current of the transistor can be reduced.

Example 2

In this example, another example of a transistor in which an In—Sn—Zn-based oxide film is used as an oxide semiconductor film will be described.

Figure 23A:
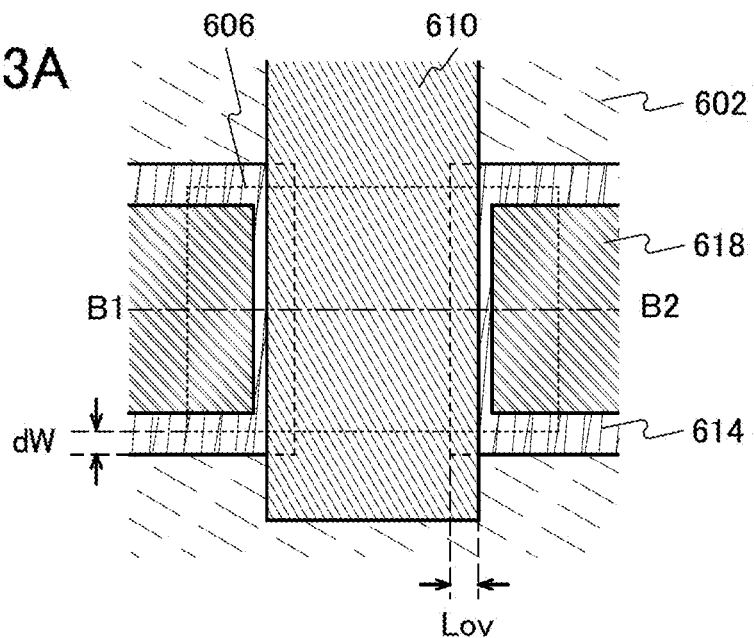
FIG. 23A is a top view of a semiconductor device.
Figure 23B:
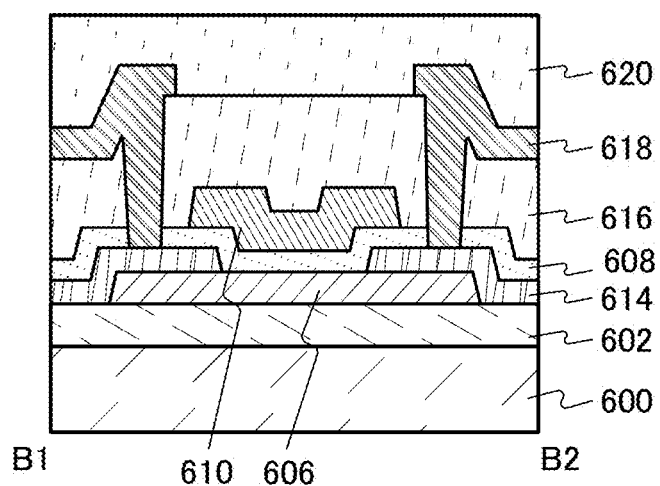
FIG. 23B is a cross-sectional view thereof.

FIGS. 23A and 23B are a top view and a cross-sectional view which illustrate a structure of a transistor fabricated in this embodiment. FIG. 23A is the top view of the transistor. FIG. 23B is a cross-sectional view along dashed-dotted line B1-B2 in FIG. 23A.

The transistor illustrated in FIG. 23B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 connected to the pair of electrodes 614 through openings formed in the interlayer insulating film 616; and a protective film 620 provided to cover the interlayer insulating film 616 and the wirings 618.

As the substrate 600, a glass substrate can be used. As the base insulating film 602, a silicon oxide film can be used. As the oxide semiconductor film 606, an In—Sn—Zn—O film can be used. As the pair of electrodes 614, a tungsten film can be used. As the gate insulating film 608, a silicon oxide film can be used. The gate electrode 610 can have a layered structure of a tantalum nitride film and a tungsten film. The interlayer insulating film 616 can have a layered structure of a silicon oxynitride film and a polyimide film. The wirings 618 can each have a layered structure in which a titanium film, an aluminum film, and a titanium film are formed in this order. As the protective film 620, a polyimide film can be used.

Note that in the transistor having the structure illustrated in FIG. 23A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

This application is based on Japanese Patent Application serial No. 2011-102567 filed with Japan Patent Office on Apr. 29, 2011 and Japanese Patent Application serial No. 2011-112818 filed with Japan Patent Office on May 19, 2011, the entire contents of which are hereby incorporated by reference.

What is claimed is:

1. A semiconductor device comprising:
    a memory cell comprising:
        a first transistor; and
        a first capacitor electrically connected to the first transistor, a reference memory cell comprising:
        a second transistor, the second transistor being an n-type;
        a second capacitor, one electrode of the second capacitor being electrically connected to one of a source and a drain of the second transistor; and
        a third transistor, the third transistor being a p-type, and a gate of the third transistor being electrically connected to the one electrode of the second capacitor; and
    a comparator being electrically connected to one of a source and a drain of the third transistor,
    wherein the comparator is configured to generate a signal based on a change in a current of the third transistor,
    wherein both the memory cell and the reference memory cell are configured to be refreshed based on the signal supplied from the comparator, and
    wherein each of the first transistor and the second transistor comprises an oxide semiconductor layer.

2. The semiconductor device according to claim 1, further comprising a resistor being electrically connected to the comparator and the one of the source and the drain of the third transistor.

3. The semiconductor device according to claim 1, wherein a gate of the first transistor and a gate of the second transistor are electrically connected to each other.

4. The semiconductor device according to claim 1, wherein a capacitance of the second capacitor is smaller than a capacitance of the first capacitor.

5. The semiconductor device according to claim 1, wherein the oxide semiconductor layer comprises at least one of indium and zinc.

6. The semiconductor device according to claim 1, wherein the third transistor is formed using a semiconductor substrate.

7. A semiconductor device comprising:
a memory cell comprising:
   a first transistor; and
   a first capacitor electrically connected to the first transistor,
a reference memory cell comprising:
   a second transistor, the second transistor being an n-type;
   a second capacitor, one electrode of the second capacitor being electrically connected to one of a source and a drain of the second transistor; and
   a third transistor, the third transistor being a p-type, and a gate of the third transistor being electrically connected to the one electrode of the second capacitor; and
a comparator being electrically connected to one of a source and a drain of the third transistor,
wherein the comparator is configured to generate a signal based on a change in a current of the third transistor,
wherein both the memory cell and the reference memory cell are configured to be refreshed based on the signal supplied from the comparator, and
wherein each of the first transistor and the second transistor comprises:
   an oxide semiconductor layer comprising a first region, a second region, and a channel formation region between the first region and the second region;
   a gate insulating film over the oxide semiconductor layer;
   a gate electrode over the gate insulating film;
   a source electrode over and in contact with the first region; and
   a drain electrode over and in contact with the second region.

8. The semiconductor device according to claim 7, further comprising a resistor being electrically connected to the comparator and the one of the source and the drain of the third transistor.

9. The semiconductor device according to claim 7, wherein a gate of the first transistor and a gate of the second transistor are electrically connected to each other.

10. The semiconductor device according to claim 7, wherein a capacitance of the second capacitor is smaller than a capacitance of the first capacitor.

11. The semiconductor device according to claim 7, wherein the oxide semiconductor layer comprises at least one of indium and zinc.

12. The semiconductor device according to claim 7, wherein each of the first transistor and the second transistor further comprises a sidewall insulating film being in contact with a side surface of the gate electrode.

13. The semiconductor device according to claim 7, wherein each of the first transistor and the second transistor further comprises a sidewall insulating film being in contact with a side surface of the gate electrode, the first region, and the second region.

14. The semiconductor device according to claim 7, wherein each of the first transistor and the second transistor further comprises a sidewall insulating film being in contact with a side surface of the gate electrode and the channel formation region.

15. The semiconductor device according to claim 7, wherein each of the first region and the second region comprises any one of phosphorus, nitrogen, and a rare gas.

16. The semiconductor device according to claim 7, wherein the third transistor is formed using a semiconductor substrate.

* * * * *